US011936342B2

(12) United States Patent
Marbell et al.

(10) Patent No.: US 11,936,342 B2
(45) Date of Patent: Mar. 19, 2024

(54) OUTPUT-INTEGRATED TRANSISTOR AMPLIFIER DEVICE PACKAGES INCORPORATING INTERNAL CONNECTIONS

(71) Applicant: Wolfspeed, Inc., Durham, NC (US)

(72) Inventors: Marvin Marbell, Morgan Hill, CA (US); Jonathan Chang, Morgan Hill, CA (US); Haedong Jang, San Jose, CA (US); Qianli Mu, San Jose, CA (US); Michael LeFevre, Morgan Hill, CA (US); Jeremy Fisher, Raleigh, NC (US); Basim Noori, San Jose, CA (US)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 482 days.

(21) Appl. No.: 17/313,567

(22) Filed: May 6, 2021

(65) Prior Publication Data

US 2022/0360230 A1 Nov. 10, 2022

(51) Int. Cl.
*H03F 1/02* (2006.01)
*H01L 23/498* (2006.01)
*H01L 23/66* (2006.01)
*H03F 1/56* (2006.01)

(52) U.S. Cl.
CPC ..... *H03F 1/0288* (2013.01); *H01L 23/49838* (2013.01); *H01L 23/66* (2013.01); *H03F 1/565* (2013.01); *H01L 2223/6611* (2013.01); *H01L 2223/6655* (2013.01)

(58) Field of Classification Search
CPC .......... H03F 1/0288; H03F 1/565; H03F 1/56; H03F 3/195; H01L 23/49838; H01L 23/66; H01L 2223/6611; H01L 2223/6655
See application file for complete search history.

(56) References Cited

U.S. PATENT DOCUMENTS

| | | | |
|---|---|---|---|
| 8,022,760 B2* | 9/2011 | Gajadharsing | H03F 1/08 330/124 R |
| 8,324,965 B2* | 12/2012 | Meng | H03F 3/189 330/53 |
| 9,325,280 B2 | 4/2016 | Blednov et al. | |
| 9,438,191 B2 | 9/2016 | Blednov | |

(Continued)

FOREIGN PATENT DOCUMENTS

| | | |
|---|---|---|
| EP | 3709353 A1 | 9/2020 |
| EP | 3179628 B1 | 4/2021 |

OTHER PUBLICATIONS

Notification of Transmittal of the International Search Report and the Written Opinion of the International Searching Authority, or the Declaration, in corresponding PCT Application No. PCT/US2022/027205 (dated Aug. 17, 2022).

(Continued)

*Primary Examiner* — S M Sohel Imtiaz
(74) *Attorney, Agent, or Firm* — Myers Bigel, P.A.

(57) ABSTRACT

A semiconductor device package includes a plurality of input leads and an output lead, a plurality of transistor amplifier dies having inputs respectively coupled to the plurality of input leads, and a combination circuit configured to combine output signals received from the plurality of transistor amplifier dies and output a combined signal to the output lead.

25 Claims, 13 Drawing Sheets

(56) References Cited

U.S. PATENT DOCUMENTS

| | | | |
|---|---|---|---|
| 9,628,032 B1* | 4/2017 | Marbell | H03F 3/195 |
| 2015/0333706 A1* | 11/2015 | Blednov | H04B 1/0483 |
| | | | 455/114.3 |
| 2017/0026001 A1* | 1/2017 | Moronval | H03F 3/245 |
| 2017/0230009 A1* | 8/2017 | Moronval | H03F 1/565 |
| 2018/0034419 A1* | 2/2018 | Moronval | H03F 3/604 |
| 2020/0295714 A1* | 9/2020 | Qureshi | H03F 3/245 |
| 2020/0304074 A1 | 9/2020 | Jang et al. | |

OTHER PUBLICATIONS

Cripps, S.C., "Advanced Techniques in RF Power Amplifier Design", (Chapter 2), Norwood, MA: Artech House, 2002.

I. Blednov, "Wideband 3 Way Doherty RFIC with 12 dB Back-Off power range", Proceedings of the 11th European Microwave Integrated Circuits Conference, Oct. 3-4, 2016, London UK, pp. 17-20.

* cited by examiner

OUTPUT-INTEGRATED TRANSISTOR AMPLIFIER DEVICE PACKAGES INCORPORATING INTERNAL CONNECTIONS

FIELD

The present disclosure relates to transistor devices and, more particularly, to transistor amplifiers and related device packages.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, high efficiency, good linearity and handle high output power levels.

Some transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based transistor amplifiers are often implemented using laterally diffused metal oxide semiconductor ("LDMOS") transistors. Silicon LDMOS transistor amplifiers can exhibit high levels of linearity and may be relatively inexpensive to fabricate. Group III nitride-based transistor amplifiers are often implemented as High Electron Mobility Transistors ("HEMT") and are primarily used in applications requiring high power and/or high frequency operation where LDMOS transistor amplifiers may have inherent performance limitations.

Transistor amplifier packages may include one or more amplification stages, with each stage typically implemented as a transistor amplifier chip or "die." In order to increase the output power and current handling capabilities, transistor amplifier dies are typically implemented in a "unit cell" configuration in which a large number of individual "unit cell" transistors are arranged electrically in parallel. A transistor amplifier package may be implemented as a single die or may include a plurality of dies.

Transistor amplifiers packages are often integrated with matching circuits, such as (1) impedance matching circuits that are designed to improve the impedance match (for signals at the fundamental operating frequency of the amplifier) between the transistor die and transmission lines connected thereto and (2) harmonic termination circuits that are designed to at least partly terminate harmonics that may be generated during device operation, such as second and third order harmonics. The transistor die(s) as well as the impedance matching and harmonic termination circuits may be enclosed in a package. Electrical leads may extend from the package that are used to electrically connect the transistor die to external circuit elements such as input and output transmission lines and bias voltage sources.

The design of modern telecommunication systems may need to deliver a wide range of output power levels with high efficiency and high linearity. Traditionally, such systems would include a balanced transistor amplifier configured to handle the highest power level with maximum available efficiency. As a result, when the system is operating at less than maximum power, which may include a large portion of the operation cycle, the overall efficiency of the system may be lowered.

One type of transistor amplifier package that can address this issue is a Doherty amplifier. The Doherty amplifier can accommodate signals with high peak-to-average power ratios by using two amplifier circuits to accommodate different signal levels. In this way, the amplifier achieves a high level of linearity while retaining good power efficiency over a range of signal levels. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split into multiple sub-components (e.g., using a quadrature coupler), and the sub-components are fed to respective amplifiers. The outputs of the amplifiers are then combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

FIG. 1 is a schematic diagram of a two-way Doherty transistor amplifier 10. As shown in FIG. 1, the Doherty transistor amplifier 10 includes an RF input 11, an input splitter 13, a main amplifier 14, a peaking amplifier 15, an output combiner 18 and an RF output 19. The Doherty transistor amplifier 10 may optionally include input matching networks and/or output matching networks (not shown).

In some embodiments, the input splitter 13 may change the relative phases of the signals provided to the main amplifier 14 and the peaking amplifier 15. For example, in some embodiments, the signal provided to the main amplifier 14 may be 90 degrees out of phase with the signals provided to the peaking amplifier 15. Similarly, in some embodiments, the output combiner 18 may, in some embodiments, include output phasing lines and be configured to adjust the phase of the output of the main amplifier 14 and/or the peaking amplifier 15.

In FIG. 1, the Doherty amplifier 10 includes only two amplifiers, but Doherty amplifiers may include different numbers (e.g., N) of peak and main amplifiers. For example, FIG. 2 is a schematic diagram of a three-way Doherty amplifier 30. It will be understood that only 3 amplifiers are shown, but the number of amplifiers could be higher. As shown in FIG. 2, the three-way Doherty transistor amplifier 30 includes an RF input 31, a first input splitter 13_1, a second input splitter 13_2, a main amplifier 14, a first peaking amplifier 15_1, a second peaking amplifier 15_2, a first output combiner 18_1, a second output combiner 18_2, and an RF output 39. The main amplifier 14, the first peaking amplifier 15_1, and the second peaking amplifier 15_2 are often implemented as separate packaged transistor devices.

The RF input 31 may be coupled to the first input splitter 13_1. A first output of the first input splitter 13_1 may be coupled to the main amplifier 14 and a second output of the first input splitter 13_1 may be coupled to the second input splitter 13_2. As with the Doherty amplifier 10 of FIG. 1, the outputs of the first input splitter 13_1 may be separated in phase by 90 degrees. The outputs of the second input splitter 13_2 may be coupled to the first peaking amplifier 15_1 and the second peaking amplifier 15_2. The inputs to the first and second peaking amplifiers 15_1, 15_2 may also be out of phase with one another.

The outputs of the main amplifier 14, first peaking amplifier 15_1, and second peaking amplifier 15_2 may be combined in a staged fashion. For example, the outputs of the first peaking amplifier 15_1 and second peaking amplifier 15_2 may be coupled to the second output combiner 18_2. The output of the main amplifier 14 and the output of the second output combiner 18_2 may be coupled to the first output combiner 18_1, which provides the RF output 39. The first output combiner 18_1 and/or the second output combiner 18_2 may be configured to convert a phase of one or more of the signals input to the combiner.

FIG. 2 also includes an input and output matching network. For example, an input match circuit 32 may be respectively coupled to inputs of each of the main amplifier 14, the first peaking amplifier 15_1, and the second peaking amplifier 15_2. An output match circuit 34 may be respectively coupled to outputs of each of the main amplifier 14, the first peaking amplifier 15_1, and the second peaking amplifier 15_2. The input match circuits 32 and/or the output match circuits 34 may be configured to perform impedance matching and/or harmonic termination for received signals. Each of the input match circuits 32 and each of the output match circuits 34 may be configured to receive a bias signal configured to bias the elements of the respective circuit.

In order to improve the performance of the 3-way Doherty amplifier 30, each of the input match circuits 32 and/or the output match circuits 34 may need to be configured separately. That is to say that the elements of a first input match circuit 32 may be different from those of a second input match circuit 32. Similarly, the elements of a first output match circuit 34 may be different from those of a second output match circuit 34. The configuration of the input match circuits 32 and/or the output match circuits 34 may be dependent on the frequency range of operation and/or the provided load to which the 3-way Doherty amplifier 30 is connected. Moreover, as noted above, each of the input match circuits 32 and/or the output match circuits 34 may be coupled to a separate bias signal. Thus, configuring the 3-way Doherty amplifier 30 may be complex and lacking in flexibility, and the space used to contain the number of circuits, including the splitters, combiners, input match circuits, output match circuits, and bias wiring may be limiting. The latter challenge can be an issue as the need for smaller devices with higher integration increases. As the number of amplifiers in the Doherty combination increases (e.g., to more than two or three amplifiers), the issues related to complexity and package size increase as well.

SUMMARY

Pursuant to embodiments of the present invention, a semiconductor device package includes a plurality of input leads and an output lead, a plurality of transistor amplifier dies having inputs respectively coupled to the plurality of input leads, and a combination circuit configured to combine output signals received from the plurality of transistor amplifier dies and output a combined signal to the output lead.

In some embodiments, the plurality of transistor amplifier dies are second transistor amplifier dies, the plurality of input leads are a plurality of second input leads, and the output lead is a second output lead, and the semiconductor device package further includes a first input lead, a first output lead, and a first transistor amplifier die coupled between the first input lead and the first output lead In some embodiments, the first transistor amplifier die is a main amplifier of a Doherty amplifier and the plurality of second transistor amplifier dies are peaking amplifiers of the Doherty amplifier.

In some embodiments, the combination circuit is within the semiconductor device package.

In some embodiments, wherein the output lead is a plurality of output leads, and wherein the combination circuit is further configured to output the combined signal to each of the plurality of output leads.

In some embodiments, the semiconductor device package further includes a plurality of output prematch circuits respectively between ones of the plurality of transistor amplifier dies and the combination circuit.

In some embodiments, the combination circuit comprises a printed circuit board (PCB).

In some embodiments, at least one of the plurality of output prematch circuits comprises a capacitor mounted to the PCB of the combination circuit.

In some embodiments, at least one of the plurality of output prematch circuits comprises a capacitor coupled to the PCB of the combination circuit by a bond wire.

In some embodiments, the plurality of input leads are configured to receive a plurality of input signals that are respectively out of phase with one another.

Pursuant to embodiments of the present invention, a semiconductor device package includes: a first transistor amplifier die coupled to a first input lead of the semiconductor device package; and a plurality of second transistor amplifier dies respectively coupled to a plurality of second input leads of the semiconductor device package. An output lead of the semiconductor device package is configured to output a combination of output signals of respective ones of the plurality of second transistor amplifier dies.

In some embodiments, the semiconductor device package is a Doherty amplifier package, the plurality of second transistor amplifier dies comprise a first peaking transistor amplifier and a second peaking transistor amplifier of the Doherty amplifier package, and the first transistor amplifier die comprises a main amplifier of the Doherty amplifier package.

In some embodiments, the semiconductor device package is further configured to combine the output of the first transistor amplifier die with the combination of the output of the plurality of second transistor amplifier dies.

In some embodiments, a plurality of output leads of the semiconductor device package are configured to output the combination of the output signals.

In some embodiments, the semiconductor device package further includes a combination circuit configured to generate the combination of the output signals of the respective ones of the plurality of second transistor amplifier dies.

In some embodiments, the combination circuit comprises a printed circuit board (PCB).

In some embodiments, the semiconductor device package further includes an output prematch circuit between respective ones of the plurality of second transistor amplifier dies and the combination circuit.

Pursuant to embodiments of the present invention, a semiconductor device package includes: a plurality of transistor amplifier dies, each respectively coupled to one of a plurality of input leads of the semiconductor device package; and a combination circuit configured to combine output signals from two or more of the plurality of transistor amplifier dies to generate a combined output signal and provide the combined output signal to at least one output lead of the semiconductor device package.

In some embodiments, the combination circuit comprises a printed circuit board (PCB).

In some embodiments, the semiconductor device package further includes a plurality of output prematch circuits respectively between ones of the plurality of transistor amplifier dies and the combination circuit.

In some embodiments, the combination circuit comprises a capacitor of at least one of the plurality of output prematch circuits.

In some embodiments, at least one of the plurality of output prematch circuits comprises a capacitor coupled to the combination circuit by a bond wire.

In some embodiments, the plurality of transistor amplifier dies are second transistor amplifier dies, and the at least one output lead is at least one second output lead, and the semiconductor device package further comprises a first transistor amplifier die coupled to a first input lead of the plurality of input leads of the semiconductor device package.

In some embodiments, the first transistor amplifier die is a main amplifier of a Doherty amplifier and the plurality of second transistor amplifier dies are peaking amplifiers of the Doherty amplifier.

In some embodiments, the combination circuit is further configured to combine the output signals from the two or more of the plurality of second transistor amplifier dies with an output signal of the first transistor amplifier die to generate the combined output signal.

DETAILED DESCRIPTION

Figure 1:
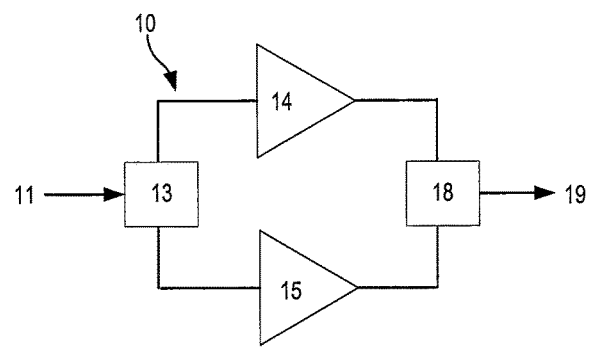
FIG. 1 is a schematic diagram of a Doherty transistor amplifier.

The present disclosure describes a method and device in which the output of a plurality of the transistor dies of a package (e.g., one or more peaking amplifiers) are combined inside a packaged device using a connector that connects the outputs of the transistor dies along an edge plane (e.g., using PCB-based components). As an example, a packaged device may be a 3-way packaged amplifier configured as a Doherty amplifier, with three input RF leads, and three output RF leads. However, two of the transistor dies of the package (e.g., the peaking amplifiers in a Doherty configuration) may be Doherty combined internally in the package on the output side of the amplifiers. By utilizing such a configuration, the output matching network external to the package (which can be configured with PCB components) can be done with the ease and flexibility of a 2-way Doherty, while the input side matching may still be implemented as a 3-way Doherty. The configuration may provide a simpler and more flexible output matching circuit (on the output side), while maintaining the benefits of a 3-way Doherty. The present disclosure is not limited to a Doherty amplifier. In some embodiments, the internal output combination may be utilized to provide other types of amplifier configurations while allowing for simpler and less complex output matching.

Embodiments of the present disclosure may provide beneficial solutions over packaged devices incorporating multiple transistor dies. Referring back to FIG. 2, it can be seen that N-way Doherty amplifiers can provide challenges to circuit design. Using a three-way Doherty amplifier as an example, the three-way Doherty amplifier may provide improved efficiency at higher back-off power levels (e.g., 9.5 dB), but the typical solutions involve three separate package devices which may increase the cost of the overall solution. In addition, 90 and 180 degree phasing lines (e.g., to combine the outputs signals from all of the amplifiers) may be needed at the output side of the device to combine the output signals of the amplifiers, which may increase the complexity of the design and/or lead to narrow band performance.

One potential solution to minimize the cost of such a configuration is to integrate the second and third packaged amplifiers (e.g., the peaking amplifiers) into one package, but with two separate input and output leads (i.e., a push-pull packaged amplifier). While this may provide a small improvement in the cost, the close proximity of the second and third leads may worsen the circuit complexity problem, and may worsen the narrow band response problem. The narrower spacing of the leads may reduce the amount of area to provide output matching and/or combining circuits, without reducing the complexity of the output matching and/or combining circuits.

Another potential solution is to integrate all three amplifier stages onto one package, with three separate input and output leads. This may further decrease the cost, but may also increase the circuit complexity. The output leads may have to be very narrow to avoid isolation problems, and there may be little room left for the output circuit of each amplifier and the $90/180$ degree combining lines, thus leading to a narrow band design.

Some methods that may be used to minimize the adverse effects of poor isolation between the adjacent leads involve leaving a bigger gap between the leads or inserting a ground strip. Either of those methods may leave less space for the leads, which may result in even narrower leads and worse RF performance.

Another alternative is to use a 2-way Doherty architecture with a high asymmetry ratio, but this may have a non-desirable efficiency versus power profile, and may also be very non-linear. Such a solution may relinquish many of the benefits of the N-way Doherty amplifier with respect to power efficiency.

According to some embodiments of the present disclosure, a package incorporating an internal connection and/or combination between the outputs of multiple transistors of the device package may provide a number of advantages over the current devices, while allowing for less complex output matching circuitry that may utilize less space. For example, embodiments of the present disclosure may enable an N-way Doherty amplifier to be implemented using the output-matching circuit of a 2-way (asymmetric) Doherty amplifier. The internal combination may be provided by a combination node internal to the package that provides a combined output signal to one or more output leads of the device package.

Some embodiments of the present disclosure may provide a Doherty combination node that exists on an "edge plane combination node" (which may also be referred to herein simply as an "edge plane" or "edge"). As used herein, an edge plane combination node refers to a physical combination structure in which the electrical signals to be combined (e.g., the output signal of multiple amplifier dies) are electrically connected along a physical plane that laterally extends in a first direction such that the combination structure is configured to combine and/or mix the flow of electrical signals along the plane. The signal coming from the transistor die may flow perpendicularly into the edge plane, and a majority and/or all points on the edge plane have same or similar phase difference with respect to the output lead. In some embodiments, the edge plane may be implemented with printed circuit board (PCB) components. As used herein, the edge plane is not required to be uniform in material and may be composed of different types of materials electrically connected together. For example, portions of the edge plane may include multiple types of conductive structures including conductive traces, conductive/metal leads and/or bond wires. By implementing the Doherty combination on an edge plane instead of by a point node (e.g., at an intersection of wires/traces), embodiments of the present disclosure can be easily scaled up to larger peripheries for more power.

In embodiments according to the Present disclosure, since the internally combined signal (e.g., from the internally combined peaking amplifier dies) can be provided/connected to multiple output leads, a wide (and low impedance) PCB matching circuit can be used and/or connected to the multiple leads. There may be no need for separate matching leads that are smaller and/or skinnier so as to connect to individual ones of the output leads. Also, the ability to connect the matching circuit to multiple leads may allow a single DC feed (e.g., for biasing) to be applied to all of the combined amplifiers (e.g., all of the combined peaking amplifier dies) and/or the output matching network. Typically, it is challenging to fit a separate DC feed for each peaking amplifier die in N-way Doherty amplifiers.

Some embodiments of the present disclosure may provide a device package in which the output-integrated peaking amplifiers can share a single base-band decoupling capacitor since the peaking amplifiers may already be connected with a low inductance path (i.e., separate base-band decoupling is not needed).

In some embodiments of the present disclosure, the Doherty combination of the peaking amplifier dies may use load-modulation from a complex-to-complex load. Some related Doherty amplifiers may modulate from a real-to-real load. The complex-to-complex load modulation utilized by embodiments of the present disclosure may provide greater flexibility to the types of pre-matching circuitry that may be used in the integrated Doherty amplifier.

By operating on a principle of Doherty modulation from complex-to-complex load, parasitic inductance from the transistor die to the Doherty combination element that combines the output signals may not degrade the performance of the Doherty amplifier. Parasitic inductance from the wire-bonds connecting the transistor die to the combination node element and/or the PCBs may be difficult to avoid, but may be used as part of the Doherty combination method of the present disclosure.

Figure 3:
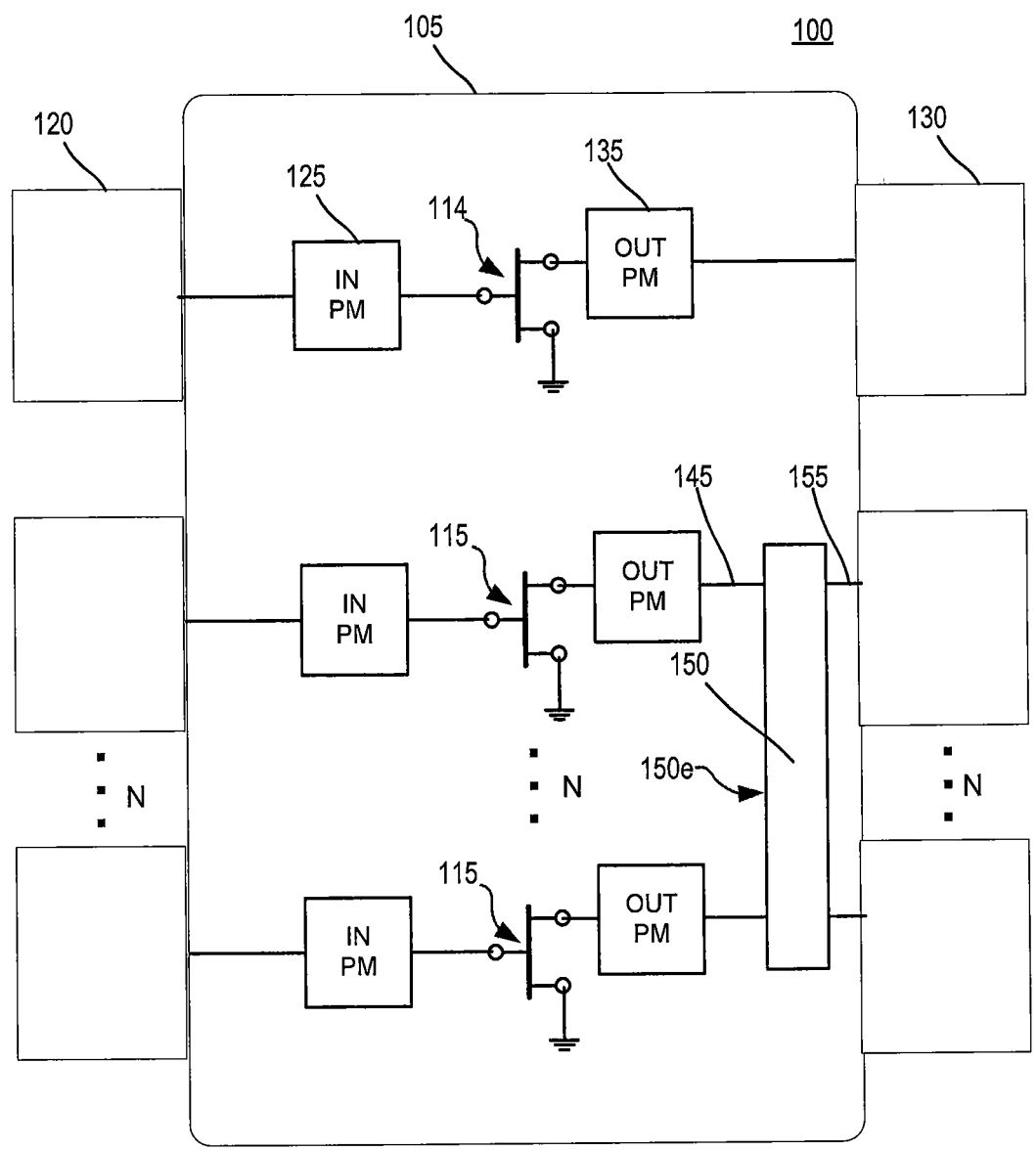
FIG. 3 is a schematic diagram of an amplifier package according to some embodiments of the present disclosure.

FIG. 3 is a schematic diagram of an amplifier package 100 according to some embodiments of the present disclosure.

Referring to FIG. 3, an amplifier package 100 according to some embodiments of the present disclosure may include a plurality of transistor amplifier dies such as one or more first transistor amplifier dies 114 and one or more second transistor amplifier dies 115. In FIG. 3, one first transistor amplifier die 114 and N second transistor amplifier dies 115 are illustrated, but the present disclosure is not limited thereto. In some embodiments, the amplifier package 100 may be a Doherty amplifier, and the one or more first transistor amplifier dies 114 may be main amplifiers and the one or more second transistor amplifier dies 115 may be peaking amplifiers. In such embodiments, the one or more first transistor amplifier dies 114 may be biased differently than the one or more second transistor amplifier dies 115. In some embodiments, the one or more second transistor amplifier dies 115 may each have a same size of transistor amplifier die. In some embodiments, the one or more first transistor amplifier dies 114 may have a different die size than the one or more second transistor amplifier dies 115.

The one or more first transistor amplifier dies 114 and the one or more second transistor amplifier dies 115 may be disposed on a submount 105 of the amplifier package 100. In some embodiments, the submount 105 may include materials configured to assist with the thermal management of the amplifier package 100. For example, the submount 105 may include copper and/or molybdenum. In some embodiments, the submount 105 may be composed of multiple layers and/or contain vias/interconnects. In an example embodiment, the submount 105 may be a multi-layer copper/molybdenum/copper metal flange that comprises a core molybdenum layer with copper cladding layers on either major surface thereof. In some embodiments, the submount 105 may include a metal heat sink that is part of a lead frame or metal slug.

Though not expressly illustrated in FIG. 3, the amplifier package 100 may include sidewalls to form an open cavity into which the first and second transistor amplifier dies 114, 115 are placed and/or the amplifier package 100 may include a plastic overmold that at least partially surrounds the first and second transistor amplifier dies 114, 115. As used herein, an "internal" portion of the amplifier package is considered to include areas within sidewalls of the amplifier package 100 and/or encapsulated by a material (e.g., an overmold material) of the amplifier package 100.

The amplifier package 100 may include input leads 120 and output leads 130. Respective ones of the input leads 120 may be coupled to a control terminal (e.g., a gate) of the first transistor amplifier dies. 114 or the second transistor amplifier dies 115. In some embodiments, an input prematch circuit 125 may be coupled between respective ones of the input leads 120 and respective ones of the first or second transistor amplifier dies 114, 115. The input prematch circuit 125 may be configured to perform input impedance matching and/or harmonic termination, as well as other input signal conditioning functions. In some of the embodiments, the input prematch circuits 125 may be identical or may be different from one another. That is to say that a first input prematch circuit 125 coupled to the first transistor amplifier die 114 may be different from a second input prematch circuit 125 coupled to one of the second transistor amplifier dies 115. Similarly, input prematch circuits 125 coupled to different ones of the second transistor amplifier dies 115 may be different from one another.

Output terminals (e.g., a drain) of the first transistor amplifier die 114 and the second transistor amplifier dies 115 may be respectively coupled to one of the output leads 130. In some embodiments, an output prematch circuit 135 may be coupled between the first transistor amplifier die 114 and the output lead 130. An output prematch circuit 135 may also be coupled to output terminals (e.g., drains) of one or more of the second transistor amplifier dies 115. The output prematch circuit 135 may be configured to perform output impedance matching and/or harmonic termination, as well as other output signal conditioning functions. In some of the embodiments, the output prematch circuits 135 may be identical or may be different from one another. That is to say that a first output prematch circuit 135 coupled to the first transistor amplifier die 114 may be different from a second output prematch circuit 135 coupled to one of the second transistor amplifier dies 115. Similarly, output prematch circuits 135 coupled to different ones of the second transistor amplifier dies 115 may be different from one another.

Output signals 145 that are transmitted from the output terminals of the second transistor amplifier dies 115 may be internally (e.g., internal to the amplifier package 100) combined by a combination circuit 150. The combination circuit 150 may be configured to combine the output signals 145 of the second transistor amplifier dies 115 to generate a combined output signal 155. The combined output signal 155 may be provided to one or more of the output leads 130 of the amplifier package 100. Though the combination circuit 150 is illustrated as being coupled to multiple output leads 130, the embodiments of the present disclosure are not limited thereto. In some embodiments, the combination circuit 150 may be coupled to a single output lead 130.

In some embodiments, the combination circuit 150 may include one or more PCB components. The PCB components may be attached to and/or mounted within the amplifier package 100 using conductive epoxy or other suitable material (e.g., solder, Ag sintering, etc.). In some embodiments, an appropriate PCB core material (e.g., a core with low thermal expansion in a Z-direction that is perpendicular to an upper surface of the PCB component), may be used to avoid delamination, such as when used in over-molded packages.

In some embodiments, the combination circuit 150 may allow for a Doherty combination of the output signals of the second transistor amplifier dies 115. Some Doherty amplifier configurations incorporate combining circuitry that performs impedance modulation that is targeted to go from a real to real impedance. That is to say that the combining circuitry performs impedance transformation and phase rotation to provide a load impedance as seen from the peak and/or main amplifier that comprises primarily real (e.g., resistive) components. Such combining circuitry may be represented schematically, for example, by a first output combiner 18_1 and/or a second output combiner 18_2 of FIG. 2. The configuration required to meet the real-to-real post impedance matching network may, however, result in limitations on the bandwidth of the device and increase the complexity of configuration of the device. In particular, additional phasing lines added in order to get the load modulation trajectory back to real impedances may significantly reduce the bandwidth. However, as appreciated by the inventors, Doherty combination circuitry may still combine the signals adequately even if the load impedance includes complex components. That is, a satisfactory Doherty combination may be achieved with a complex-to-complex load modulation.

Figure 9A:
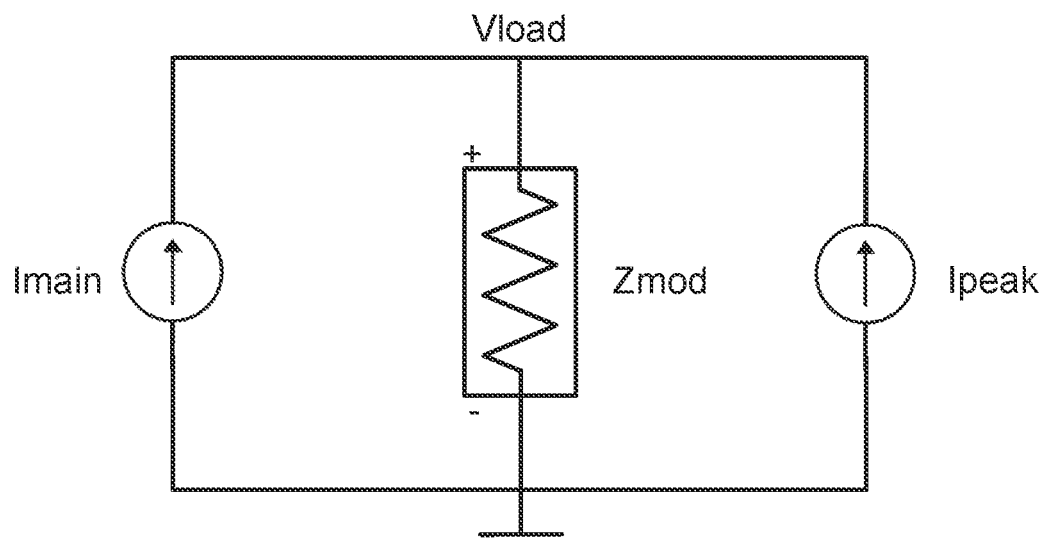
FIGS. 9A and 9B are a circuit diagram and Smith chart, respectively, illustrating theories of operation for load modulation from a complex-to-complex load.

As one theory of operation, it is believed that conditions of the load modulation of the Doherty amplifier may be configured so that complex-to-complex modulation may be performed in a way that provides good Doherty performance while providing additional advantages of simplicity and compact implementation. An explanation of this operations will be provided with reference to FIGS. 9A and 9B.

During operation of a Doherty amplifier incorporating a main and a peak amplifier, such as the main and peak amplifiers 14, 15 of FIG. 1, the load impedance seen from the main amplifier is modulated from a starting impedance Z1m to an ending impedance Z2m. Likewise, the load impedance seen from the peak amplifier is modulated from Z1p to Z2p. Analysis of the load modulation is discussed, for example, in Cripps, S. C., Advanced Techniques in RF Power Amplifier Design, Norwood, Mass.: Artech House, 2002. The trajectory of this load modulation can be analyzed with the simplified circuit shown in FIG. 9A in which the main and peak amplifiers are represented by the current sources Imain and Ipeak, both of which drive current into a summing node impedance Zmod. The impedances seen from the main and peak amplifiers, Zmain and Zpeak can be expressed as:

$$Z_{main} = Z_{mod}\left(\frac{I_{main} + I_{peak}}{I_{main}}\right) \quad (1)$$

$$Z_{peak} = Z_{mod}\left(\frac{I_{main} + I_{peak}}{I_{peak}}\right) \quad (2)$$

where Imain and Ipeak are given as $$I_{main} = I_m e^{i\varnothing_m}, I_{peak} = I_p e^{i\varnothing_p} \quad (3)$$

Imain and Ipeak are complex current source representing the main and peak transistor dies respectively. For a simplified analysis, Imain is normalized so Im=1, and $\varnothing_m$=0, and remains constant during load modulation. $\varnothing_p$ is also held constant during load modulation while Ip is varied from 0 to the power ratio of peak to main amplifier, $R_{VSWR}$. The load trajectory for Zmain and Zpeak is then given by:

$$Z_{main} = Z_{mod}\left(1 + I_p e^{i\phi_p}\right) \quad (4)$$

$$Z_{peak} = Z_{mod}\left(1 + \frac{1}{I_p e^{i\phi_p}}\right) \quad (5)$$

$$\{I_p = 0 \text{ to } R_{VSWR}\}$$

Figure 9B:
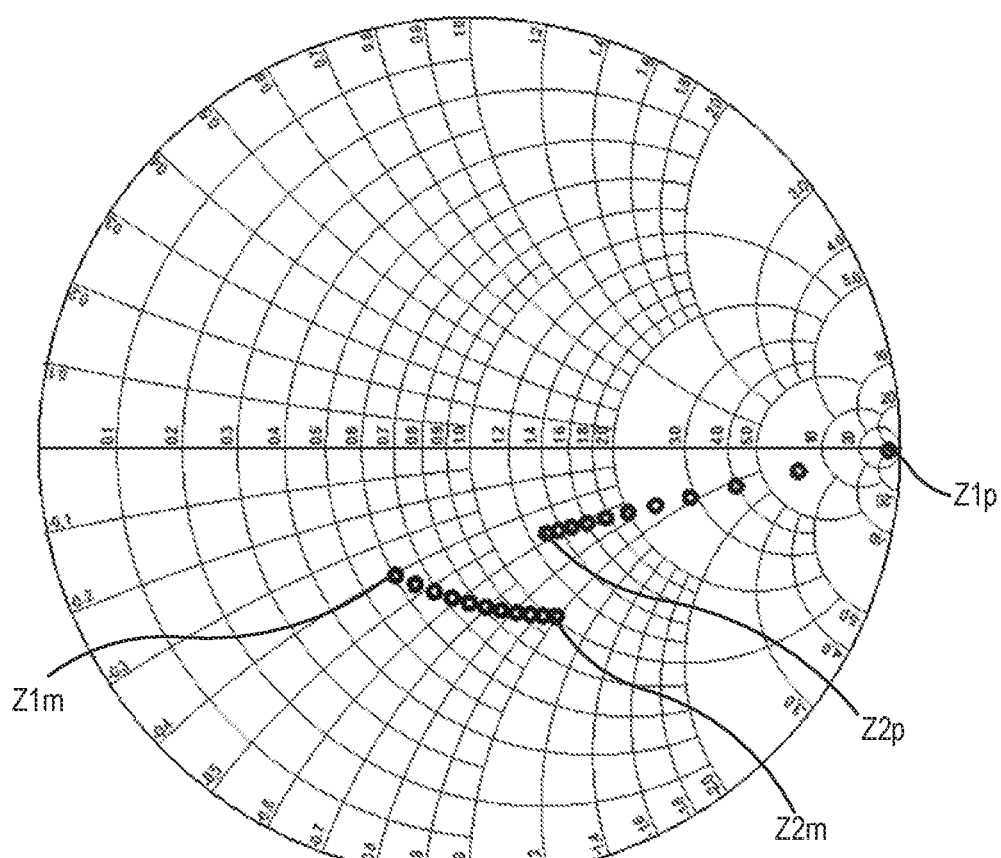

For any given value of $Ø_p$, $R_{VSWR}$ and complex impedance Zmod, a pair of modulation trajectories exists for Zmain and Zpeak (e.g., from Z1m to Z2m and from Z1p to Z2p). FIG. 9B is an example Smith chart illustrating the modulation trajectory for the case where $Ø_p$=−21 degrees, $R_{VSWR}$=1, and Zmod=3-2j Ohms. This modulation trajectory is plotted on a Smith chart normalized to 5 ohms.

The integrated output Doherty combining may work on the principle that the arrangement of wire bonds and capacitors in the output prematch circuit are selected so that:

Zmod=Z1m;
Zopt_main=Z2m;
Zoffpeak*=Z1p; and
Zopt_peak=Z2p, where Zmod and Zopt_main corresponds to the optimum impedance of the main power amplifier at backed-off power levels and full power level respectively, Zopt_peak corresponds to the optimum impedance of the peak power amplifier, and Zoff_peak corresponds to the peaking off-state impedance.

In addition, integrated output Doherty combining may work when the Zmod and $Ø_p$ are selected such that real(Z1p)>>real(Zmod). In some embodiments, the configuration may be selected such that real(Z1p)>=20×real(Zmod).

As can be seen from the above discussion, an integrated output Doherty combination may be satisfactorily performed even when all four impedances are complex impedances, i.e., having an imaginary component. Though the above discussion has been provided with respect to load modulation for main and peak amplifiers, the same theory of operation is believed to work for Doherty combinations of a plurality of peaking amplifiers. Thus, according to some embodiments of the present disclosure, an effective Doherty combination may be achieved within the amplifier package 100 using an internal combination circuit 150.

In some embodiments, the internal combination circuit 150 may include an edge 150e that allows for the electrical combination of the output signals 145 of the second transistor amplifier dies 115 along a longitudinal dimension of the combination circuit 150 (or at least a major dimension of the combination circuit). The edge 150e of the combination circuit 150 may provide increased flexibility to the amplifier package 100. In some conventional configurations, combination circuitry is provided in a "node" configuration. Stated another way, the output signal of the transistor amplifier dies that are to be combined are coupled to a transmission line or node on the transistor bond pad or other internal package element having a relatively small connection area. As a result, if a size of the transistor die coupled to the combination circuitry is increased, the combination circuitry must be moved or otherwise reconfigured, making adjustments to the device difficult. According to some embodiments of the present disclosure, providing a combination circuit 150 with an extending lateral edge 150e allows for the connection areas of the device to automatically scale with the size of the transistor amplifier dies being used. The edge 150e provides a relatively large connection surface that can adjust to different sizes of the second transistor amplifier dies 115, allowing the amplifier package 100 to be more flexible, while still providing a sufficient connection plane to provide an appropriate Doherty combination signal.

Figure 4A:
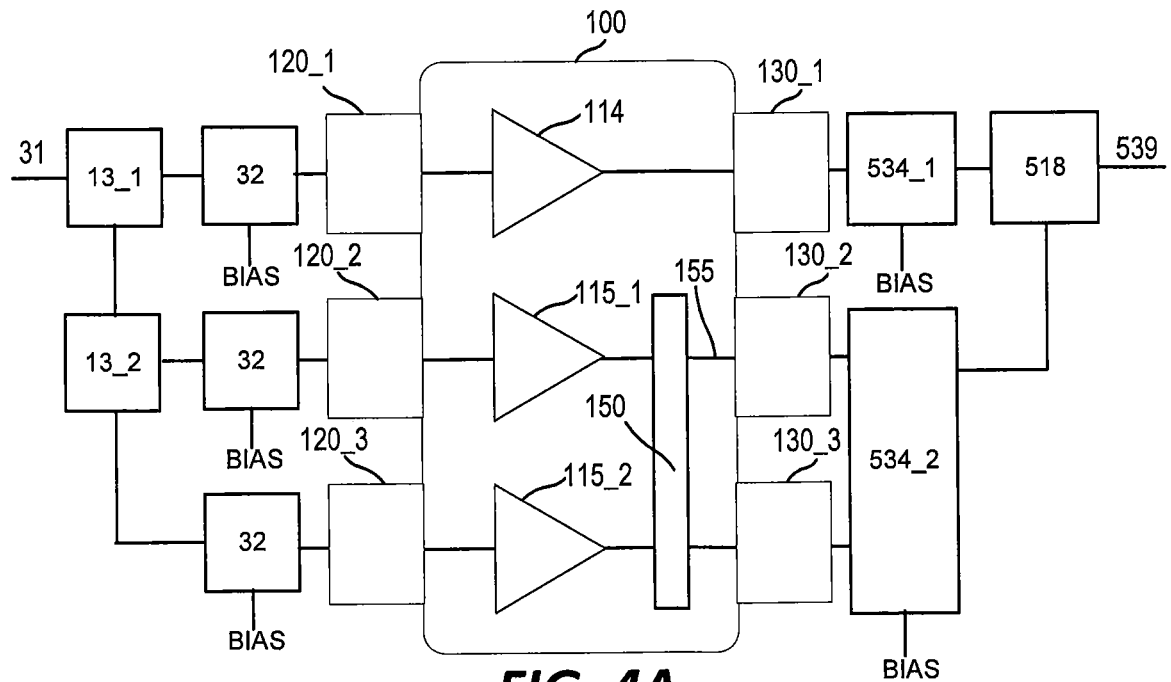
FIGS. 4A to 4C are schematic diagrams illustrating configurations of an amplifier package that incorporate input and output matching networks, according to some embodiments of the present disclosure.
Figure 4B:
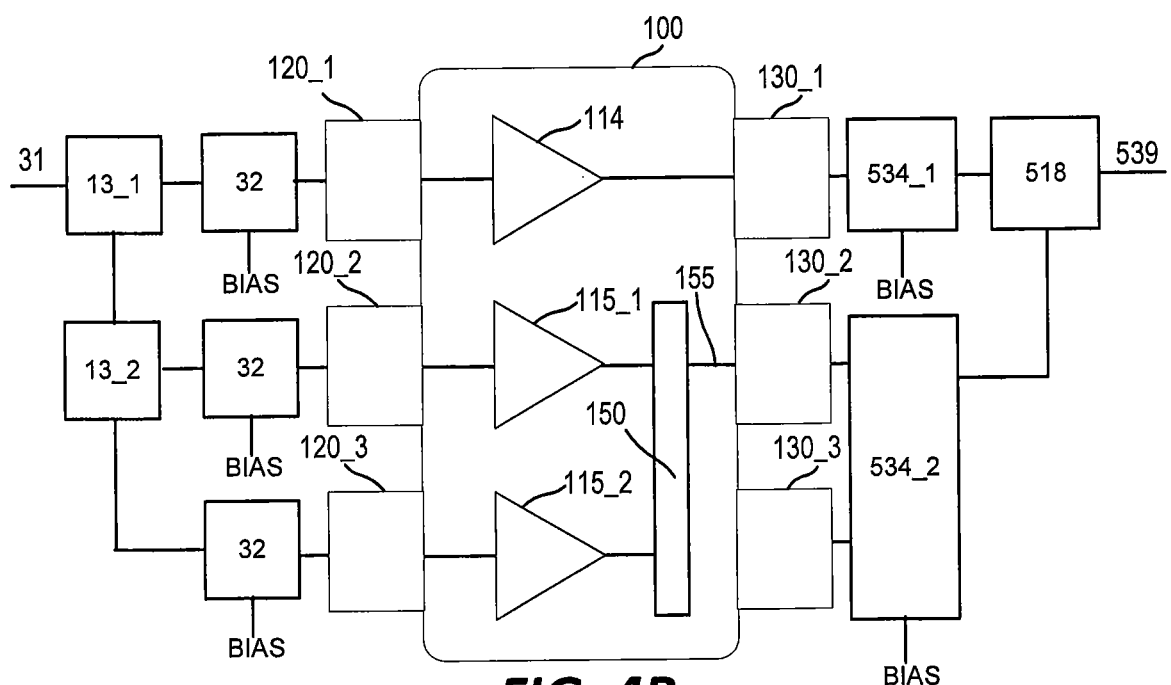
Figure 4C:
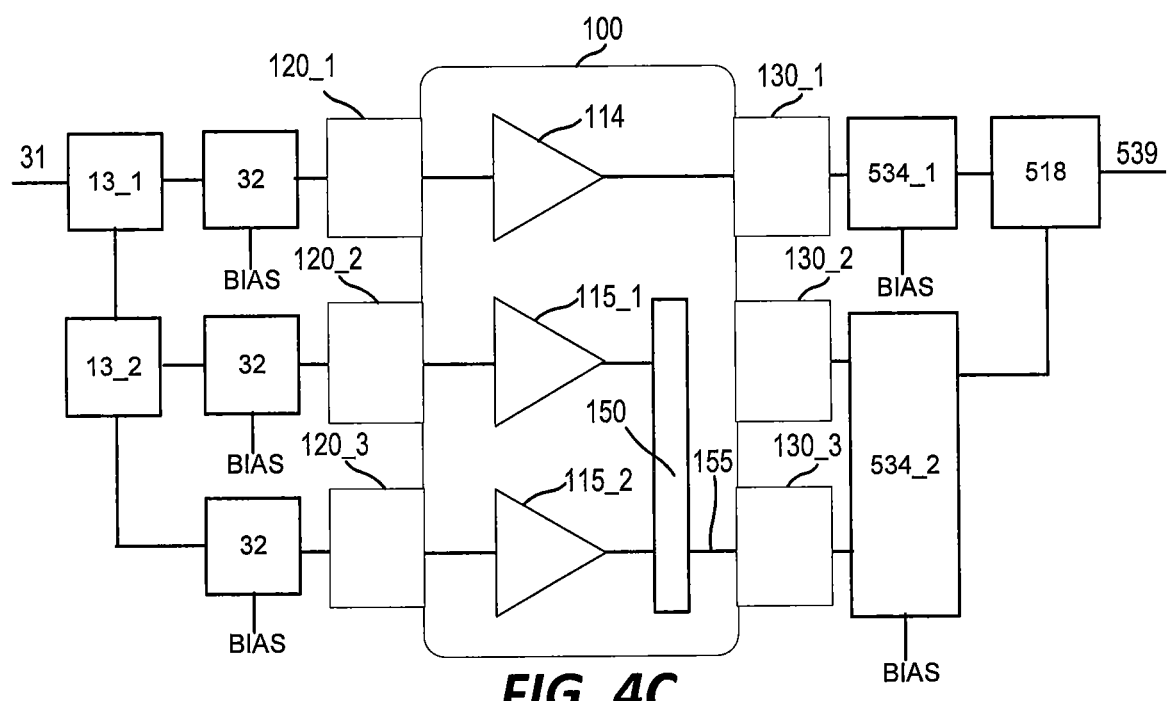

FIGS. 4A to 4C are schematic diagrams illustrating configurations of the amplifier package 100 that incorporate input and output matching networks, according to some embodiments of the present disclosure. FIGS. 4A to 4C illustrate, in part, some of the benefits that accrue from the use of the amplifier package 100 incorporating the internal combination circuit 150. In FIGS. 4A to 4C, an example of a three-way Doherty amplifier is illustrated, but it will be understood that this is merely an example, and that an N-way Doherty amplifier or an amplifier other than a Doherty amplifier could be used as well Without deviating from the present disclosure. In FIGS. 4A to 4C the input and output prematch circuits shown in FIG. 3 are omitted for brevity, but may be present in some embodiments without deviating from the scope of the present disclosure.

Figure 2:
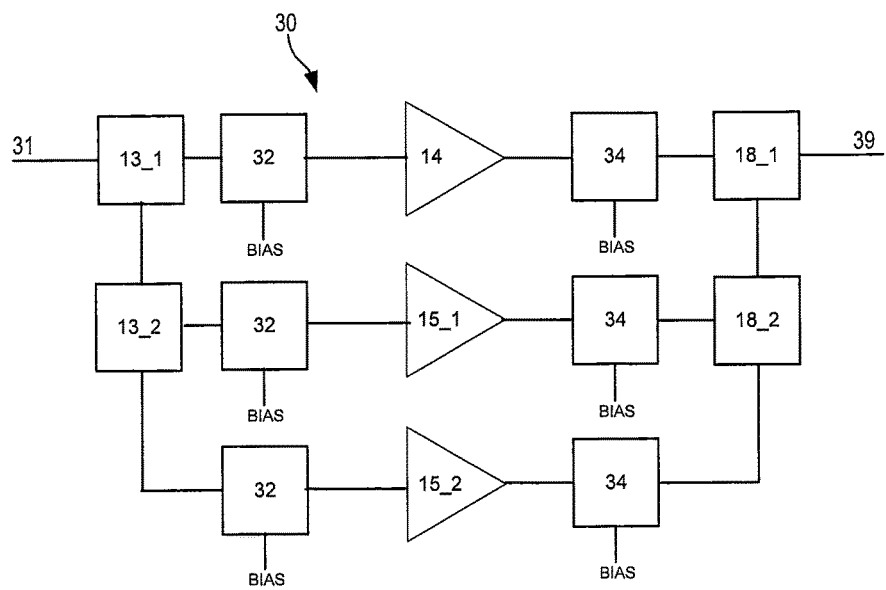
FIG. 2 is a schematic diagram of a three-way Doherty amplifier.

Referring to FIG. 4A, the amplifier package 100 may be coupled to a plurality of input splitters and an input matching network in a manner similar to that described herein with respect to FIG. 2. For example, the RF input 31 may be coupled to the first input splitter 13_1. A first output of the first input splitter 13_1 may be coupled to a first input lead 120_1 of the amplifier package 100 through an input match circuit 32 and a second output of the first input splitter 13_1 may be coupled to the second input splitter 13_2. The first input lead 120_1 may be coupled to the first transistor amplifier die (e.g., the main amplifier) 114 internal to the amplifier package 100.

The outputs of first input splitter 13_1 may be separated in phase (e.g., by 90 degrees). The outputs of the second input splitter 13_2 may be coupled to a second input lead 1202 and a third input lead 120_3 through input match circuits 32, respectively. The inputs to the second and third input leads 120_2, 120_3 may also be arranged to be out of phase with one another (e.g., by 90 degrees) by the second input splitter 13_2. The second input lead 120_2 and the third input lead 120_3 may be respectively coupled to a first of the second transistor amplifier dies (e.g., a first peaking amplifier) 115_1 and a second of the second transistor amplifier dies (e.g., a second peaking amplifier) 115_2 internal to the amplifier package 100.

As illustrated in FIG. 4A, the input network to the amplifier package 100 may be configured in a similar way to the 3-way Doherty amplifier of FIG. 2 with the exception that the transistors of the Doherty amplifier are included in a common amplifier package 100.

However, the output network of the amplifier package 100 differs from that of FIG. 2. As illustrated in FIG. 4A, the amplifier package 100 provides an integrated package providing first through third output leads 130_1, 130_2, 130_3. The first output lead 130_1 may be coupled to an output of the first transistor amplifier die 114. The second and third output leads 130_2, 130_3 may be coupled to the output of the combination circuit 150. As discussed herein with respect to FIG. 3, the combination circuit 150 may provide a combined signal 155 that combines the output signals of the second transistor amplifier dies 115_1, 115_2. Thus, each of the second and third output leads 130_2, 130_3 may provide the combined output signal 155 of the first and second peaking amplifier dies 115_1, 115_2, as discussed herein with respect to FIG. 3. As a result, the output lead 130_1 and the output leads 130_2, 130_3 can be treated as an output of a 2-way Doherty amplifier. Stated another way, the configuration illustrated in FIG. 4A need only perform one combination between the output of the main transistor amplifier die 114 and the internally-combined signal 155 of the peaking transistor amplifier dies 115_1, 115_2.

For example, the output signal from the first output lead 130_1 may be coupled to an output combiner 518 through a first output match circuit 534_1. The output signals from the second output lead 130_2 and/or the third output lead 130_3 may be coupled to the output combiner 518 through a second output match circuit 534_2. The output of the output combiner 518 may be provided as the RF output 539. The output combiner 518 may perform load modulation and/or phase matching between the output signal from the first output lead 130_1 and the output signal from the second output lead 130_2 and/or the third output lead 130_3.

This configuration provides a number of advantages over the configuration of, for example, FIG. 2. As can be seen in FIG. 4A, the output network is much simpler. Rather than multiple output combiners, a single output combiner 518 may be used, simplifying the configuration. As the output combiner 518 may include components that can limit bandwidth, the configuration of FIG. 4A may provide the power efficiency of a 3-way Doherty amplifier while providing the simpler output configuration of a 2-way Doherty amplifier.

In addition, the configuration of FIG. 4A incorporates fewer output match circuits 534_1, 534_2. This provides at least two benefits. First, by reducing the number of output match circuits, more space is provided for the circuits themselves. This allows the size of the output match circuit to increase compared to conventional devices, allowing for additional configuration capacity. Moreover, each of the output match circuits may utilize biasing (shown by BIAS signals) which may require additional wiring connectivity and routing. As can be seen in a comparison of FIG. 4A to FIG. 2, the use of fewer output match circuits 534_1, 534_2 allows the number of bias circuits that are needed to be reduced as well, which allows for more flexibility in configuring and placing the amplifier package 100.

In FIG. 4A, the second output match circuit 534_2 is illustrated as being coupled to both the second output lead 130_2 and the third output lead 130_3. In some embodiments, this connection may be made by bond wires. In some embodiments, the second output match circuit 534_2 may be configured partially as a PCB inside the package, and partially with PCB transmission lines external to the package. The bond wires may also form part of the circuit for coupling the internal package PCB to the second output lead 130_2 and third output lead 130_3.

Though the embodiments of FIGS. 3 and 4A illustrate embodiments where the combined signal 155 from the combination circuit 150 is provided to both the second output lead 130_2 and the third output lead 130_3, it will be understood that the embodiments of the present disclosure are not limited thereto. In some embodiments, the combined signal 155 from the combination circuit 150 may be provided to only one output lead. FIG. 4B illustrates an embodiment in which the combined signal 155 from the combination circuit 150 is provided to the second output lead 130_2. FIG. 4C illustrates an embodiment in which the combined signal 155 from the combination circuit 150 is provided to the third output lead 130_3. In some embodiments, the combined signal 155 from the combination circuit 150 may be provided to multiple output leads (e.g., both the second output lead 130_2 and the third output lead 130_3), but the output match circuit 534_2 may be coupled to only one of the output leads (e.g., the second output lead 130_2 or the third output lead 130_3) to receive the combined output signal 155.

It will be understood that the use of two second transistor amplifier dies 115 (e.g., peaking amplifier dies) and one first transistor amplifier die 114 (e.g., main amplifier die) is only for convenience of description and that other combinations could be used. For example, in some embodiments, N peaking amplifier dies 115 may be combined and N or fewer output leads 130 may be configured to provide a combined signal 155 to an output match circuit. In some embodiments, the first transistor amplifier die 114 may be a plurality of first transistor amplifier dies 114. In some embodiments, the plurality of first amplifier dies may also be internally combined/connected within the amplifier package 100 as with the combination circuit 150. In addition, the use of a single combination circuit 150 is only an example and not intended to limit the embodiments of the present disclosure. In some embodiments, multiple combination circuits 150 may be used. For example, in some embodiments, N peaking amplifier dies 115 may be present and a first combination circuit 150 may be used to combine the output of a first subset of the N peaking amplifier dies 115 (e.g., N/2 peaking amplifier dies) and a second combination circuit 150 may be used to combine the output of a second subset of the N peaking amplifier dies 115 (e.g., N/2 peaking amplifier dies). Other combinations in keeping with the present disclosure will be understood by those of ordinary skill in the art.

Figure 5:
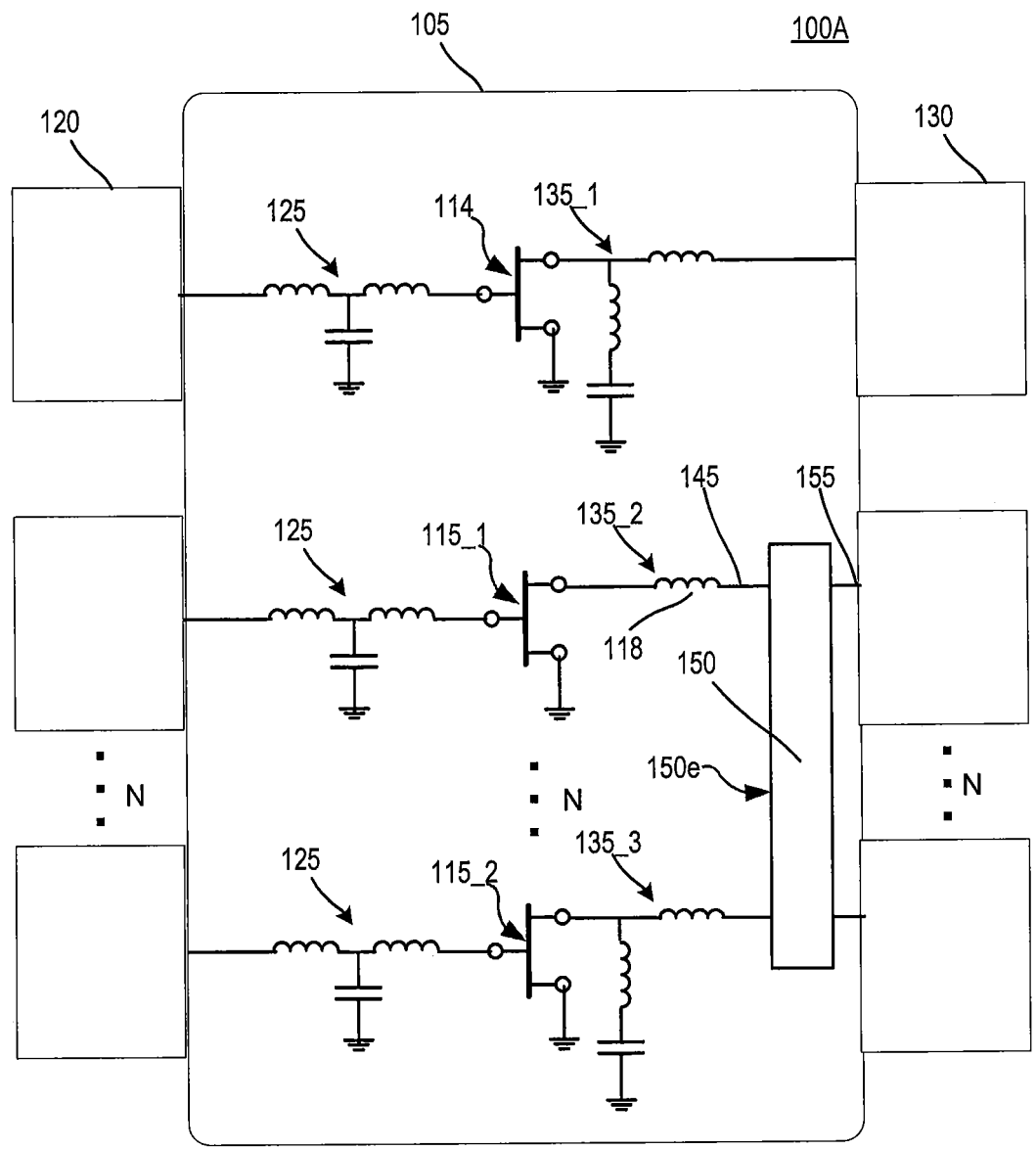
FIG. 5 is a schematic diagram illustrating an example configuration of an input and output prematch circuits, according to some embodiments of the present disclosure.

The input prematch circuits 125 and output prematch circuits 135 of FIG. 3 can be configured in various ways. FIG. 5 is a schematic diagram illustrating an example configuration of the input and output prematch circuits 125, 135 of the first and second transistor amplifier dies 114, 115, according to some embodiments of the present disclosure. A description of elements of FIG. 5 that have been previously described will be omitted for brevity. In FIG. 5, different instantiations of a particular element (e.g., a first output prematch circuit 135_1 of the output prematch circuits 135) may be given a different reference designator to assist in the description. This is merely for ease of discussion and is not intended to limit the scope of the present disclosure. Similarly, as with the previous discussion, the amplifier package 100 is illustrated with three first and second transistor amplifier dies. This is intended to only be an example and is not intended to limit the interpretation of the disclosure.

Referring to FIG. 5, an amplifier package 100A may include an input prematch circuit 125 for each first and second transistor amplifier die 114, 115. The prematch circuit 125 may use an L-C-L (low-pass) prematch, where L refers to an inductance element and C refers to a capacitance element. The input prematch circuit 125 is merely an example, and other configurations could be used without deviation from the embodiments described herein. For example, the input prematch circuit 125 could be designed with any other suitable prematch (e.g., including input harmonic termination, etc.). Similarly, the input match circuit 125 coupled to respective ones of the first and second transistor amplifiers dies 114, 115 may differ from one another.

The first transistor amplifier die 114 (e.g., the main amplifier) of amplifier package 100A may be coupled to a first output prematch circuit 135_1 incorporating a high-pass output prematch (a shunt L-C, and a series L). This is merely an example, and the first output prematch circuit 135_1 can be coupled to an output prematch circuit 135 with any appropriate pre-matching configuration (high-pass, un-matched, low-pass etc.).

A first of the second transistor amplifier dies 115_1 (e.g., a first peaking amplifier die) may be coupled to the combination circuit 150 by a second output prematch circuit 135_2 incorporating a series inductance (L) 118. In some embodiments, the series inductance 118 may be configured to shift a phase of the output signal of the first of the second transistor amplifier dies 115_1. For example, when the second transistor amplifier die 115_1 is a first peaking amplifier die, the input to the first peaking amplifier die may be out-of-phase (e.g., by 90 degrees) with the input of the second of the second transistor amplifier dies 115_2, which may be a second peaking amplifier die. The series inductance 118 may be configured to shift the phase of the output signal of the first peaking amplifier die 115_1 to be closer to the output signal of the second peaking amplifier die 115_2. In some embodiments the phases of the output signals of the first and second peaking amplifier dies 115_1, 115_2 need not exactly match to be combined by the combination circuit 150.

The second of the second transistor amplifier dies 115_2 (e.g., a second peaking amplifier die) may be coupled to the combination circuit 150 by a third output prematch circuit 135_3 incorporating a high-pass output prematch (a shunt L-C, and a series L). The inductance elements may, in some embodiments, be provided by bond wires. The capacitance elements may, in some embodiments, be provided by metal-oxide-semiconductor (MOS) and/or surface mount technology (SMT) capacitors.

Figure 6A:
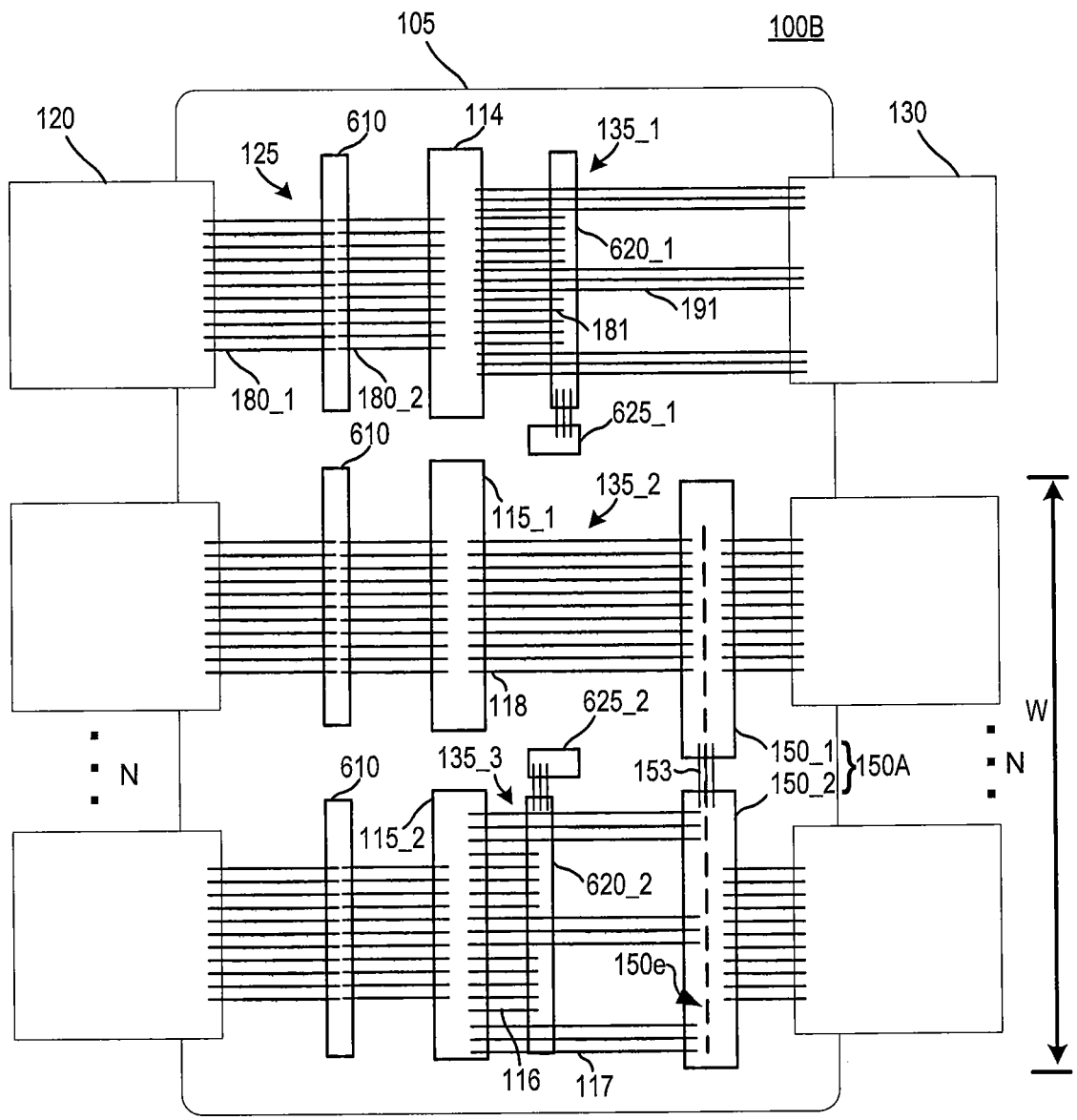
FIGS. 6A to 6C are schematic diagrams of component layouts of example packages according to embodiments of the present disclosure.
Figure 6B:
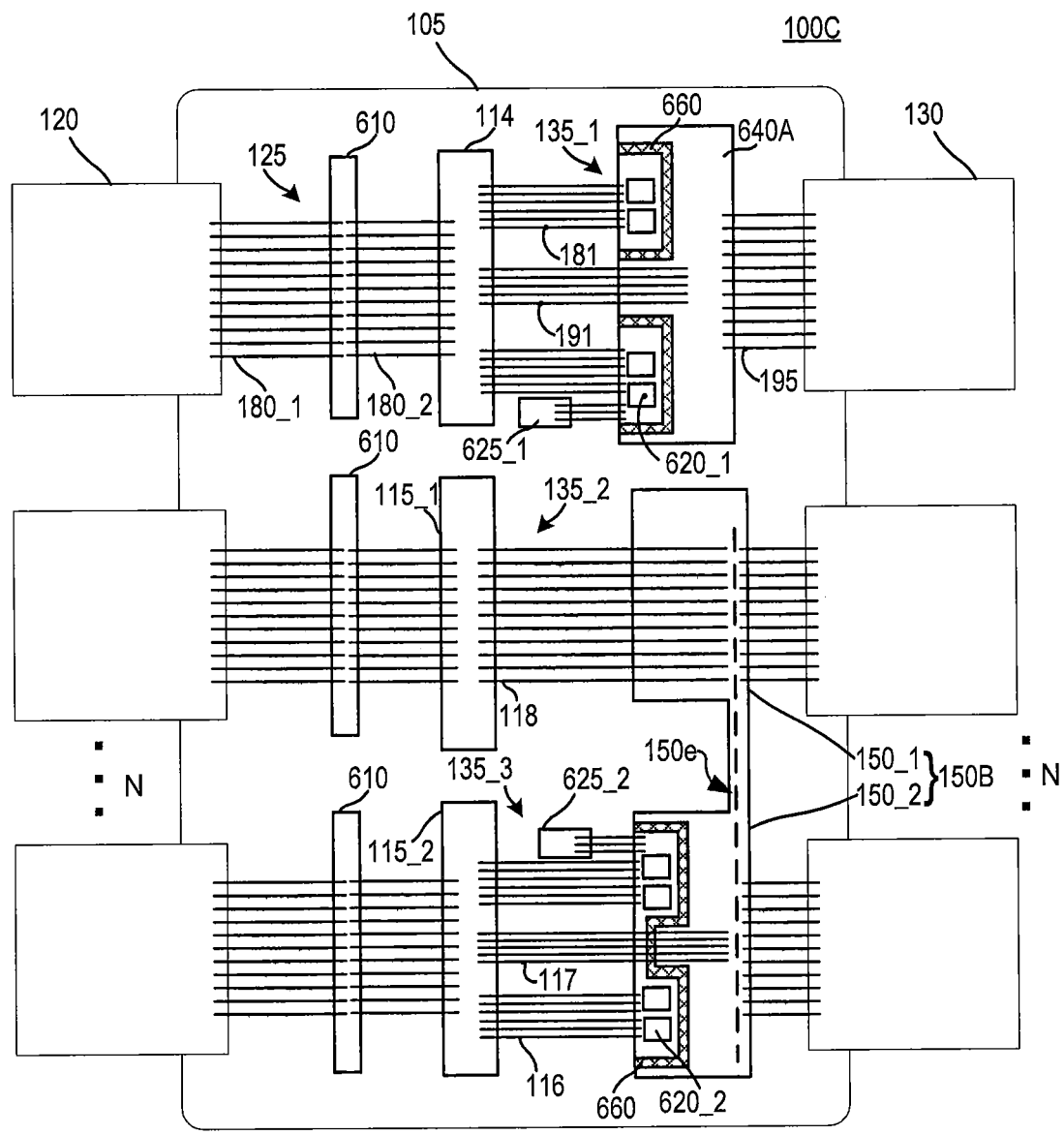
Figure 6C:
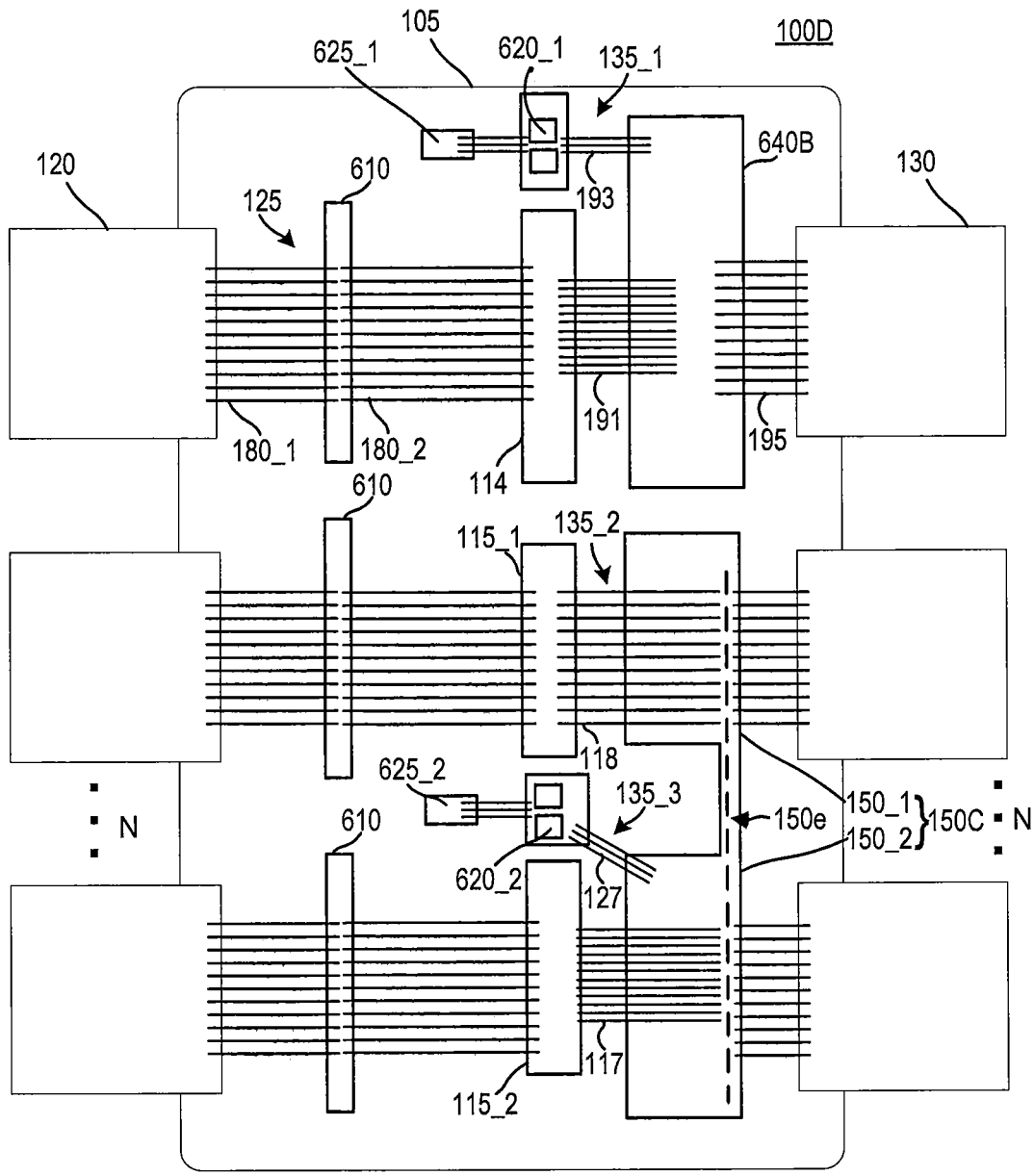

The equivalent circuit illustrated in FIG. 5 may be physically implemented in a number of package configurations. FIGS. 6A to 6C are schematic diagrams of component layouts of example packages according to embodiments of the present disclosure. A description of elements of FIGS. 6A to 6C that have been previously described will be omitted for brevity. For ease of description, FIGS. 6A to 6C omit an explicit illustration of some elements of the package, such as biasing circuits.

Referring to FIG. 6A, an amplifier package 100B may include a submount 105, input leads 120, and output leads 130. One or more first transistor amplifier dies 114 and a plurality of second transistor amplifier dies 115 (illustrated as second transistor amplifier dies 115_1 and 115_2) may be mounted on the submount 105. Respective ones of the first and second transistor amplifier dies 114, 115_1, 115_2 may be coupled to respective ones of the input leads 120 through respective input prematch circuits 125. The input prematch circuits 125 may be, in some embodiments, L-C-L circuits similar to that illustrated in FIG. 5. The L-C-L input prematch circuits 125 may be implemented, for example, by first bond wires 180_1 coupled between an input lead 120 and a capacitor 610 and second bond wires 1802 coupled between the capacitor 610 and the corresponding one of the first and second transistor amplifier dies 114, 115_1, and 115_2. The bottom side of the capacitor 610 may be coupled to a ground plane of the amplifier package 100B. In some embodiments, the capacitor 610 may be a MOS capacitor.

The first and second transistor amplifier dies 114, 115_1, and 115_2 may be respectively coupled to the output leads 130 via respective output prematch circuits 135 (illustrated as a first output prematch circuit 135_1, a second output prematch circuit 135_2, and a third output prematch circuit 135_3). For example, the first transistor amplifier die 114 may be coupled to an output lead 130 through the first output prematch circuit 135_1. The first output prematch circuit 135_1 may be a high-pass output prematch (a shunt L-C, and a series L). For example, the shunt L-C of the first output prematch circuit 135_1 may be implemented by first bond wires 181 coupled between the first transistor amplifier die 114 and a capacitor 620_1. The bottom side of capacitor 620_1 may be coupled to a ground plane of the amplifier package 100B. In addition, the capacitor 620_1 is coupled to a base-band decoupling capacitor 625_1 to present an optimized low impedance termination to the transistor 114 at low frequencies (e.g., below 500 MHz). In some embodiments, the base-band decoupling capacitor 625_1 may be optional and omitted. The series L of the first output prematch circuit 135_1 may be implemented by second bond wires 191 coupled between the first transistor amplifier die 114 and the output lead 130.

The first of the second transistor amplifier dies 115_1 (e.g., a first peaking amplifier die 115_1) may be coupled to an output lead 130 through a second output prematch circuit 135_2 and the combination circuit 150A. The second output prematch circuit 135_2 may be a series L. The series L of the second output prematch circuit 135_2 may be implemented by bond wires 118 coupled between the first of the second transistor amplifier die 115_1 and the combination circuit 150A.

The second of the second transistor amplifier dies 115_2 (e.g., a second peaking amplifier die 115_2) may be coupled to an output lead 130 through a third output prematch circuit 135_3 and the combination circuit 150A. The third output prematch circuit 135_3 may be a high-pass output prematch (a shunt L-C, and a series L). For example, the shunt L-C of the third output prematch circuit 135_3 may be implemented by first bond wires 116 coupled between second of the second transistor amplifier dies 115_2 and a capacitor 620_2. The bottom side of capacitor 620_2 may be coupled to a ground plane of the amplifier package 100B, and the top side may be additionally coupled to a base-band decoupling capacitor 625_2. In some embodiments, the base-band decoupling capacitor 625_2 may be optional and omitted. In some embodiments, the capacitor 620_2 may be a MOS capacitor. The series L of the third output prematch circuit 135_3 may be implemented by second bond wires 117 coupled between the second of the second transistor amplifier dies 1152 and the combination circuit 150A.

The combination circuit 150A may include a first portion 150_1 and a second portion 150_2. In some embodiments, the first and second portions 150_1, 150_2 of the combination circuit 150A may be composed of PCB components. The first and second portions 150_1, 150_2 of the combination circuit 150A may be mounted to the submount 105 using conductive epoxy or other suitable material (e.g., solder, Ag sintering, etc.) and may be connected to one another via bond wires 153. The first and second portions 150_1, 150_2 of the combination circuit 150A may each be respectively coupled to one or more output leads 130. As illustrated in FIG. 6A, the combination circuit 150A may provide an edge plane 150e for the combination of the output signals of the second transistor amplifier dies 115_1, 115_2 discussed herein. The edge 150e is shown herein as a dashed line to indicate a general configuration and location of the combining edge of the signals. However, the illustrated dashed line is not intended to limit the embodiments of the present disclosure. In some embodiments, a width W of the combination circuit 150A may extend from a portion of the interior of the amplifier package 100B that is adjacent (e.g., overlapping in a horizontal direction) a first of the second transistor amplifier dies 115_1 to a portion of the interior of the amplifier package 100B that is adjacent (e.g., overlapping in a horizontal direction) a last of the second transistor amplifier dies 115_2. Stated another way, the combination circuit 150A may extend to at least partially horizontally overlap each of the second transistor amplifier dies 115 to which it is connected. Though illustrated as having two portions 150_1, 150_2, it will be understood that the combination circuit 150A could be implemented using a single PCB component, or with more than two portions.

The combination circuit 150A may allow for the output signals of the second transistor amplifier dies 115_1, 115_2 to be combined (e.g., in a Doherty fashion) before being output from the amplifier package 100B. In some embodiments, the use of the combination circuit 150A may allow for the base-band decoupling capacitor 625_2 to be shared between the second transistor amplifier dies 115_1, 115_2. Thus, separate base-band decoupling capacitors may not be necessary.

As discussed with respect to FIG. 5, the series-L connections between the second transistor amplifier dies 115_1, 115_2 and the combination circuit 150A via bond wires 118, 117 may be used to adjust the phases of the output signals of the second transistor amplifier dies 115_1, 115_2 to be closer to one another, though not necessarily equal. Additionally, the phase difference between transistor 115_1 and the first portion 150_1 of the combination circuit 150A, and the phase difference between transistor 115_2 and the second portion 150_2 of the combination circuit 150A may differ by close to 90 degrees but not necessarily 90 degrees As will be understood by those of ordinary skill in the art, the combination circuit 150 described herein can be implemented in a number of ways. FIG. 6B illustrates an example of an amplifier package 100C in which the combination circuit 150 is configured as a single PCB element 150B that incorporates portions of the output matching circuits, such as the capacitors. Elements of FIG. 6B previously described with respect to FIG. 6A, as well as other figures, will be omitted for brevity.

Referring to FIG. 6B, the amplifier package 100C may include first, second, and third output prematch circuits 135_1, 135_2, and 135_3. The first output prematch circuit 135_1 may incorporate an output PCB 640A. The first transistor amplifier die 114 may be coupled to an output lead 130 through the output PCB 640A. As in FIG. 6A and FIG. 3, the first output prematch circuit 135_1 may be a high-pass output prematch (a shunt L-C, and a series L), though the embodiments of the present disclosure are not limited thereto. As illustrated in FIG. 6B, the shunt L-C of the first output prematch circuit 135_1 may be implemented by first bond wires 181 coupled between the first transistor amplifier die 114 and one or more capacitors 620_1. The one or more capacitors 620_1 may be mounted to the output PCB 640A. For example, the one or more capacitors 620_1 may be SMT capacitors bonded or otherwise mounted to the output PCB 640A. At least one of the capacitors 620_1 may be coupled to a base-band decoupling capacitor 625_1 to provide low impedance termination at low frequencies (e.g., below 500 MHz). In some embodiments, the base-band decoupling capacitor 625_1 may be optional and omitted. The series L of the first output prematch circuit 135_1 may be implemented by second bond wires 191 that are coupled to the output PCB 640A and/or third bond wires 195 that may be coupled between the output PCB 640A and one of the output leads 130.

The second transistor amplifier dies 115_1, 115_2 may be coupled to one or more of the output leads 130 via the combination circuit 150B. The combination circuit 150B may include a first portion 150_1 and a second portion 150_2 integrally connected to one another. In some embodiments, the connection between the first and second portions 150_1, 150_2 of the combination circuit 150B may provide the edge plane 150e for the combination of the output signals of the second transistor amplifier dies 115_1, 115_2 discussed herein. In some embodiments, the first and second portions 150_1, 150_2 of the combination circuit 150B may be or include PCB components.

In some embodiments, elements of the output prematch circuits 135 may be incorporated within the combination circuit 150B. For example, elements of the inductances of the output prematch circuits 135 may be provided within the combination circuit (e.g., by traces of the PCB). In some embodiments, the capacitors of the output prematch circuits 135 may be mounted to the PCB, or otherwise incorporated in the PCB structure, of the combination circuit 150B.

For example, the first of the second transistor amplifier dies 115_1 (e.g., a first peaking amplifier 115_1) may be coupled to an output lead 130 through a second output prematch circuit 135_2 and the combination circuit 150B. The second output prematch circuit 135_2 may be a series L. The series L of the second output prematch circuit 135_2 may be implemented by bond wires 118 coupled between the first of the second transistor amplifier dies 115_1 and the first portion 150_1 of the combination circuit 150B. In some embodiments, portions of the inductance of the second output prematch circuit 135_2 may be provided by traces or other elements of the combination circuit 150B. Such a configuration may allow the bond wires 118 to be shorter than in other embodiments.

The second of the second transistor amplifier dies 115_2 (e.g., a second peaking amplifier 115_2) may be coupled to an output lead 130 through a third output prematch circuit 135_3 and the second portion 150_2 of the combination circuit 150B. The third output prematch circuit 135_3 may be a high-pass output prematch (a shunt L-C, and a series L). The shunt L-C of the third output prematch circuit 135_3 may be implemented by first bond wires 116 coupled between the second of the second transistor amplifier dies 115_2 and one or more capacitors 620_2. The one or more capacitors 620_2 may be mounted to the second portion 150_2 of the combination circuit 150B. For example, the one or more capacitors 620_2 may be SMT capacitors bonded or otherwise mounted to the second portion 150_2 of the combination circuit 150B. At least one of the capacitors 620_2 may be coupled to a base-band decoupling capacitor 625_2 to provide low impedance termination at low frequencies (e.g., below 500 MHz). In some embodiments, the base-band decoupling capacitor 625_2 may be optional and omitted. The series L of the third output prematch circuit 135_3 may be implemented by second bond wires 117 that are coupled to the second portion 150_2 of the combination circuit 150B.

The use of SMT capacitors 620_1, 620_2 as part of the output prematch circuit 135 may allow for easier configuration. As illustrated in FIG. 6B, the SMT capacitors 620_1, 620_2 may, in some embodiments, be electrically isolated from other portions of the underlying combination circuit 150B that are coupled to the output leads 130 (e.g., by isolation material 660).

The capacitors 620_1, 620_2 of the output prematch circuits 135 need not be directly incorporated into the output PCB 640A and/or combination circuit 150B, however. FIG. 6C illustrates an embodiment of an amplifier package 100D in which the capacitors 620_1, 620_2 of the output prematch circuits 135 are mounted to the submount 105. For example, as illustrated in FIG. 6C, the first transistor amplifier die 114 may be coupled to an output lead 130 through an output PCB 640B. The output PCB 640B may be similar to the output PCB 640A of FIG. 6B with the exception that the one or more capacitors 620_1 of the first output prematch circuit 135_1 may be mounted to the submount 105 rather than the output PCB 640B.

As illustrated in FIG. 6C, the shunt L-C of the first output prematch circuit 135_1 may be implemented by second bond wires 191 coupled between the first transistor amplifier die 114 and the output PCB 640B and third bond wires 193 coupled between the output PCB 640B and the one or more capacitors 620_1. The one or more capacitors 620_1 may be SMT capacitors bonded or otherwise mounted to the submount 105. At least one of the capacitors 620_1 may be coupled to a base-band decoupling capacitor 625_1 to provide low impedance termination at low frequencies (e.g., below 500 MHz). In some embodiments, the base-band decoupling capacitor 625_1 may be optional and omitted. The series L of the first output prematch circuit 135_1 may be implemented by the first bond wires 191 that are coupled to the output PCB 640B and/or third bond wires 195 between the output PCB 640B and one of the output leads 130.

A combination circuit 150C may be similar to the combination circuit 150B of FIG. 6B with the exception that the one or more capacitors 620_2 of the third output prematch circuit 135_3 may be mounted to the submount 105 in a similar manner as with the first output prematch circuit 135_1.

The second output prematch circuit 135_2 may be implemented similar to that of FIG. 6B, and a duplicate description thereof will be omitted. The shunt L-C of the third output prematch circuit 135_3 may be implemented by second bond wires 117 coupled between the second of the second transistor amplifier dies 115_2 and the second portion 150_2 of the combination circuit 150C and third bond wires 127 coupled between the second portion 150_2 of the combination circuit 150C and the one or more capacitors 620_2. The one or more capacitors 620_2 may be SMT capacitors bonded or otherwise mounted to the submount 105. At least one of the capacitors 620_2 may be coupled to a base-band decoupling capacitor 625_2 to provide low impedance termination at low frequencies (e.g., below 500 MHz). In some embodiments, the base-band decoupling capacitor 625_2 may be optional and omitted. The series L of the third output prematch circuit 135_3 may be implemented by the second bond wires 117 that are coupled to the second portion 150_2 of the combination circuit 150C.

As previously discussed, portions of the inductances of one or more of the first, second, and third output prematch circuits 135_1, 135_2, and 135_3 may be implemented as traces on the output PCB 640B and/or the combination circuit 150C. As a result, the first and second transistor amplifier dies 114, 115_1, 115_2 may be placed relatively close to the output PCB 640B or the combination circuit 150C, and the connecting bond wires (e.g., bond wires 191, 118, and/or 117) may be short as compared to other embodiments.

Figure 7:
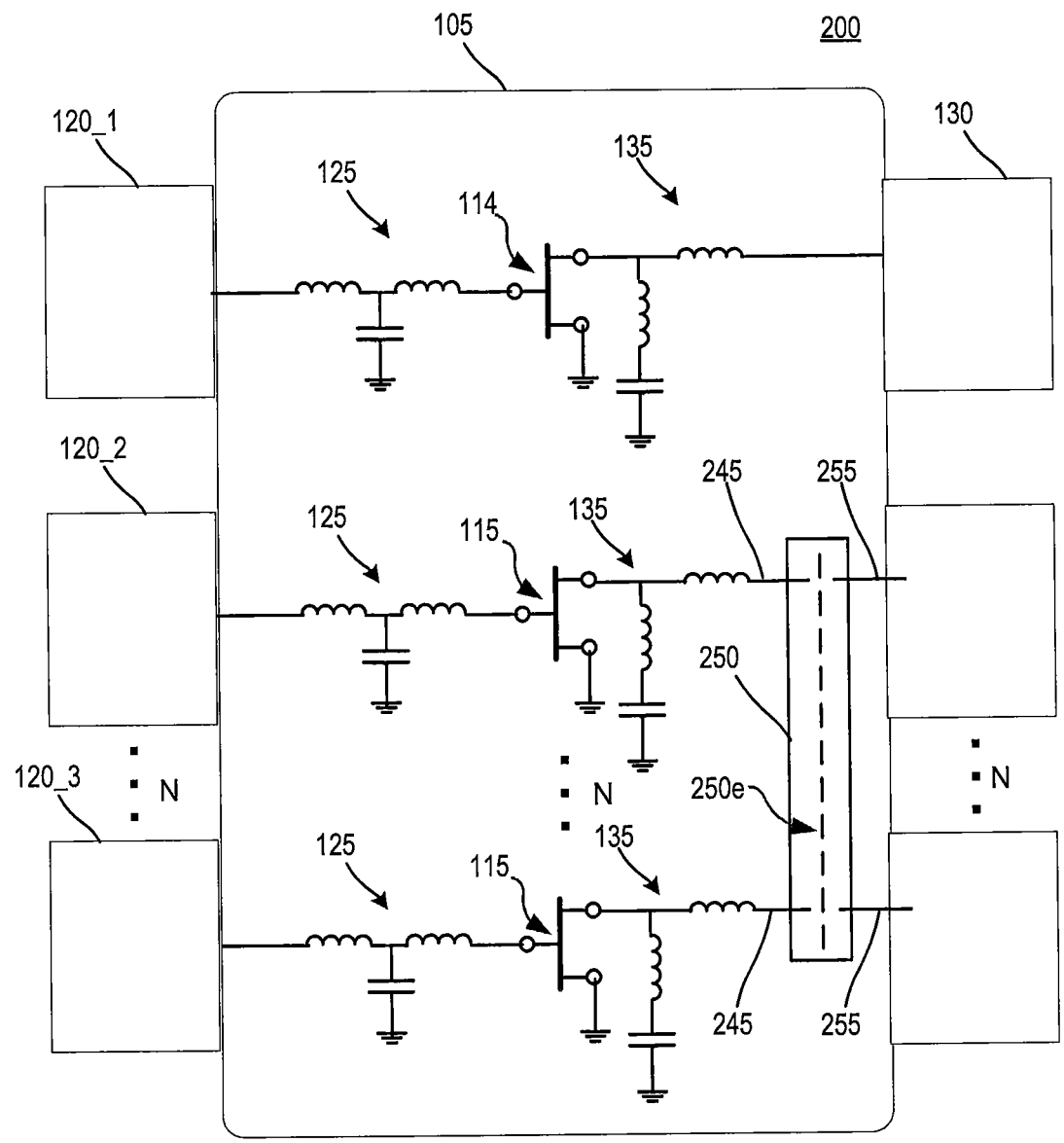
FIG. 7 is a schematic diagram of an amplifier package according to some embodiments of the present disclosure.

Though some of the embodiments described herein have incorporated an N-way Doherty amplifier, the amplifier packages of the present disclosure are not limited thereto. FIG. 7 is a schematic diagram of an amplifier package 200 according to some embodiments of the present disclosure. A description of elements of FIG. 7 that are the same or similar as previous elements will be omitted for brevity.

Referring to FIG. 7, the amplifier package 200 may include a plurality of transistor amplifier dies such as one or more first transistor amplifier dies 114 and one or more second transistor amplifier dies 115. In FIG. 7, one first transistor amplifier die 114 and N second transistor amplifier dies 115 are illustrated, but the present disclosure is not limited thereto.

The embodiment of FIG. 7 may be different from the embodiment of FIG. 3 in that each of the first and second transistor amplifier dies 114, 115 may be coupled to identical input prematch circuits 125 and identical output prematch circuits 135. The second transistor amplifier dies 115 may still be coupled to a combination circuit 250 including an edge plane 250e configured to combine the output signals 245 from the second transistor amplifier dies 115.

The embodiment of FIG. 7 may couple the second transistor amplifier dies 115 in parallel. The amplifier package 200 may be configured such that the input leads 120_2, 120_3 coupled to the second transistor amplifier dies 115 may be configured to receive the peaking amplifier signal while the input lead 120_1 coupled to the first transistor amplifier die 114 may be configured to receive the main amplifier signal. The signals provided to the input leads 120_2, 120_3 may be configured to be out-of-phase (e.g., by 90 degrees) with the signal provided to the input lead 120_1, but the signals provided to the input leads 120_2, 120_3 may be in phase with one another. Thus, rather than acting as a N-way Doherty amplifier with N−1 peaking amplifiers (e.g., a 3-way Doherty amplifier with two peaking amplifiers), the amplifier package 200 will act as a 2:1 asymmetric Doherty amplifier. The combination circuit 250 may combine the output signals 245 of the second transistor amplifier dies 115 to generate a combined signal 255 that may be provided to one or more of the output leads 130.

The amplifier package 200 may allow for a simpler configuration of a 2-way Doherty while allowing for the asymmetric nature of the Doherty amplifier to be accomplished through the parallel combination of multiple transistor amplifier dies. Another advantage may include increased stability. By combining the outputs internally to the amplifier package 200 using combination circuit 250, the outputs are combined at a lower impedance than if they were combined at the output leads 130. This technique may be used to change and/or improve an odd-mode instability situation.

Previous embodiments have described the use of a combination circuit to combine signals between a plurality of peaking amplifiers of an N-way Doherty amplifier, but the embodiments of the present disclosure are not limited thereto. In some embodiments, each of the amplifiers of the Doherty amplifier (e.g., the main and the peaking amplifiers) may be combined using a combination circuit.

Figure 8:
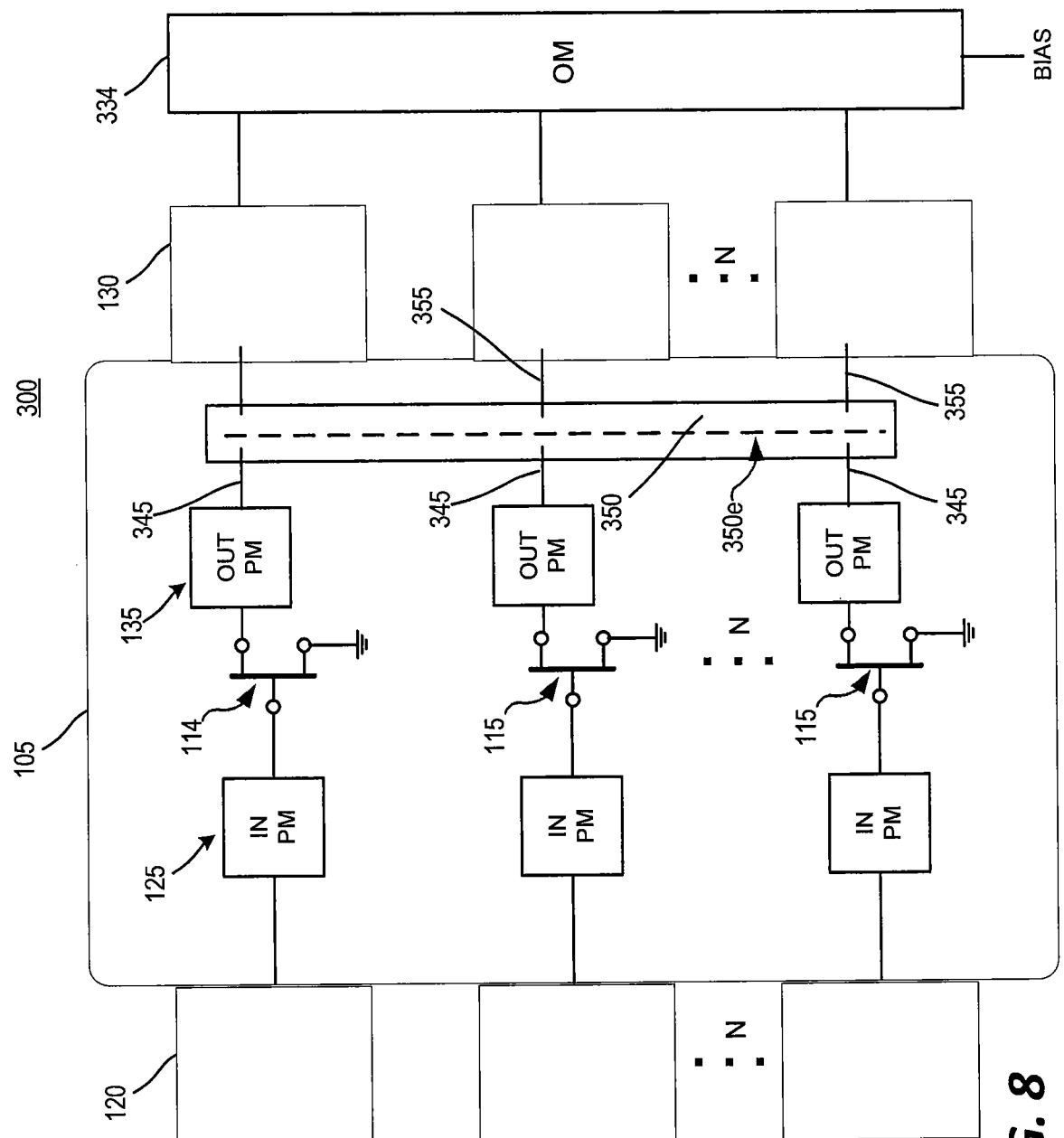
FIG. 8 is a schematic diagram of an amplifier package according to some embodiments of the present disclosure.

FIG. 8 is a schematic diagram of an amplifier package 300 according to some embodiments of the present disclosure.

Referring to FIG. 8, the amplifier package 300 may include a plurality of transistor amplifier dies such as one or more first transistor amplifier dies 114 and one or more second transistor amplifier dies 115. In FIG. 8, one first transistor amplifier die 114 and N second transistor amplifier dies 115 are illustrated, but the present disclosure is not limited thereto. In some embodiments, the amplifier package 300 may be a Doherty amplifier, and the one or more first transistor amplifier dies 114 may be main amplifier dies and the one or more second transistor amplifier dies 115 may be peaking amplifier dies. In such embodiments, the one or more first transistor amplifier dies 114 may be biased differently than the one or more second transistor amplifier dies 115. In some embodiments, the one or more second transistor amplifier dies 115 may each have a same size of transistor amplifier die. In some embodiments, the one or more first transistor amplifier dies 114 may have a different die size than the one or more second transistor amplifier dies 115. In some embodiments, each of the first and second transistor amplifier dies 114, 115 may have a same size of transistor amplifier die.

The one or more first transistor amplifier dies 114 and the one or more second transistor amplifier dies 115 may be disposed on a submount 105 of the amplifier package 300. The submount 105 may be similar to that described herein (e.g., with respect to FIG. 3) and a duplicate description thereof will be omitted. Though not expressly illustrated in FIG. 8, the amplifier package 300 may include sidewalls to form an open cavity into which the first and second transistor amplifier dies 114, 115 are placed and/or the amplifier package 300 may include a plastic overmold that at least partially surrounds the first and second transistor amplifier dies 114, 115.

The amplifier package 300 may include input leads 120 and output leads 130. Respective ones of the input leads 120 may be coupled to a control terminal (e.g., a gate) of the first transistor amplifier dies 114 or the second transistor amplifier dies 115. In some embodiments, an input prematch circuit 125 may be coupled between respective ones of the input leads 120 and respective ones of the first or second transistor amplifier dies 114, 115. In some embodiments, the input prematch circuit 125 may be similar to that described herein (e.g., with respect to FIG. 3) and a duplicate description thereof will be omitted. The input prematch circuits 125 coupled to different ones of the second transistor amplifier dies 115 may be different from one another or ones of the input prematch circuits 125 may be the same.

Respective output terminals (e.g., a drain) of the first transistor amplifier die 114 and the second transistor amplifier dies 115 may be internally (e.g., internal to the amplifier package 300) combined by a combination circuit 350. The combination circuit 350 may be configured to combine the output signals 345 of the first and second transistor amplifier dies 114, 115 to generate a combined output signal 355. The combined output signal 355 may be provided to one or more of the output leads 130 of the amplifier package 300. Though the combination circuit 350 is illustrated as being coupled to multiple output leads 130, the embodiments of the present disclosure are not limited thereto. In some embodiments, the combination circuit 350 may be coupled to a single output lead 130 or less than all of the output leads 130.

A plurality of output prematch circuits 135 may be electrically connected between respective ones of the first and second transistor amplifier dies 114, 115 and the combination circuit 350. The output prematch circuits 135 may include a number of different elements. For example, in some embodiments, the output prematch circuits 135 may be configured in a manner similar to that of FIG. 3, but it will be understood that the embodiments of the present disclosure are not limited thereto. In some embodiments, the output prematch circuit 135 of one or more of the second transistor amplifier dies 115 may include a shunt L-C component similar to those previous discussed, but the embodiments of the present disclosure are not limited thereto. In some embodiments, the output prematch circuits 135 of each of the second transistor amplifier dies 115 may include a shunt L-C component and the first amplifier die 114 may omit the shunt L-C and have only a series-L output prematch circuit 135, but the embodiments of the present disclosure are not limited thereto. Other output prematch circuits 135 may be implemented without deviating from the embodiments described herein.

In some embodiments, the combination circuit 350 may include one or more PCB components. The PCB components may be attached to and/or mounted within the amplifier package 300 using conductive epoxy or other suitable material (e.g., solder, Ag sintering, etc.). In some embodiments, an appropriate PCB core material (e.g., a core with low thermal expansion in a Z-direction), may be used to avoid delamination, such as when used in over-molded packages.

In some embodiments, the combination circuit 350 may allow for a Doherty combination of the output signals of the first and second transistor amplifier dies 114, 115. For example, each of the output signals 345 from the first and second transistor amplifier dies 114, 115 may be electrically connected to the combination circuit 350. As discussed previously, an edge plane 350e of the combination circuit 350 may allow for a combination of the output signals 345 that leverages load modulation from a complex-to-complex load. That is to say that the load modulation from a complex-to-complex load provided by the combination circuit 350 may perform combinations of both the main and peaking amplifiers of a Doherty amplifier.

The combination of the output signals 345 first and second transistor amplifier dies 114, 115 internal to the amplifier package 300 to generate the combined signal 355 may greatly simplify the output matching network. As illustrated in FIG. 8, a single output matching network 334 may be coupled to one or more of the output leads 130 of the amplifier package 300. The single output matching network 334 may be configured to perform output matching on the combined signals of the first and second transistor amplifier dies 114, 115. The use of a single output matching network 334 may allow for more space to be allocated to the output matching network 334. This may increase a flexibility of the amplifier package 300. In addition, the use of a single output matching network 334 may simplify biasing of the output matching network 334 and reduce the amount of space needed to provide biasing wiring.

Though the discussion of FIG. 8 has focused on the use of the combination circuit 350 with both the main and peaking amplifier a Doherty amplifier, the embodiments of the present disclosure are not limited thereto. In some embodiments, the first and second transistor amplifier dies 114, 115 may be configured as parallel-connected transistor amplifiers similar to that described herein with respect to FIG. 7, with an output combined by the combination circuit 350. In such embodiments, for example, the input signals provided to the input leads 120 may not be phase-shifted from one another as may be done with a conventional Doherty amplifier input. In addition, one or more of the output prematch circuits 135 may be different than those illustrated in FIG. 8.

The amplifier package 300 may be physically configured in ways similar to that of FIGS. 6A to 6C with some modifications. For example, referring back to FIGS. 6A to 6C, a third portion of a combination circuit 350 may be placed between the first transistor amplifier die 114 and a first output lead 130 of the amplifier package. The third portion of the combination circuit 350 may be positioned similarly to the output PCBs 640A, 640B of FIGS. 6B and 6C with the exception that the third portion of the combination circuit 350 is electrically connected (e.g., either with bond wires or an integral connection) with the first and second portions of the combination circuit 350.

Figure 10A:
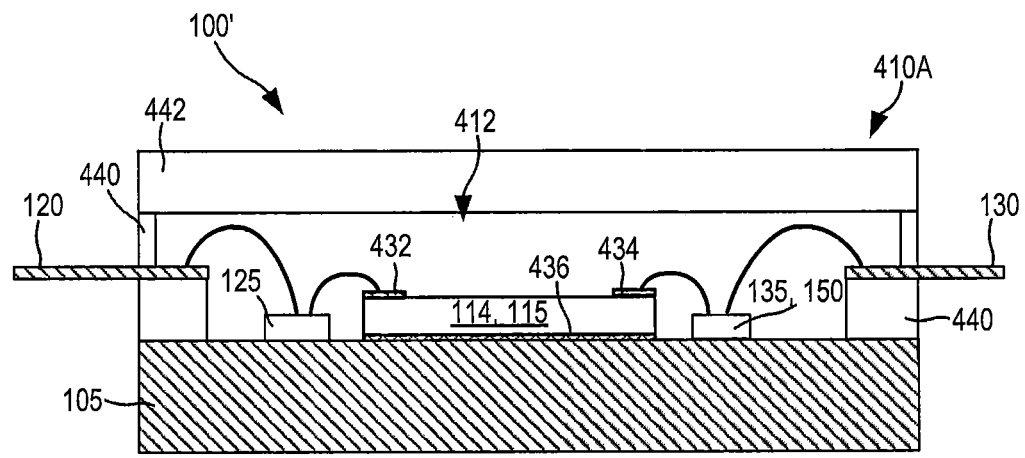
FIGS. 10A through 10C are schematic cross-sectional views illustrating several example ways that that the transistor amplifier dies according to embodiments of the present disclosure may be packaged to provide packaged transistor amplifiers.
Figure 10B:
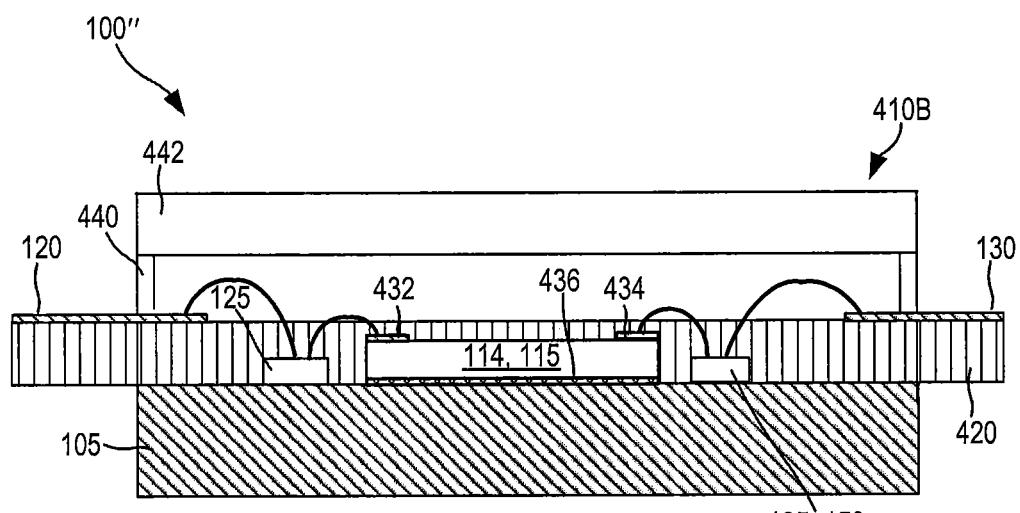
Figure 10C:
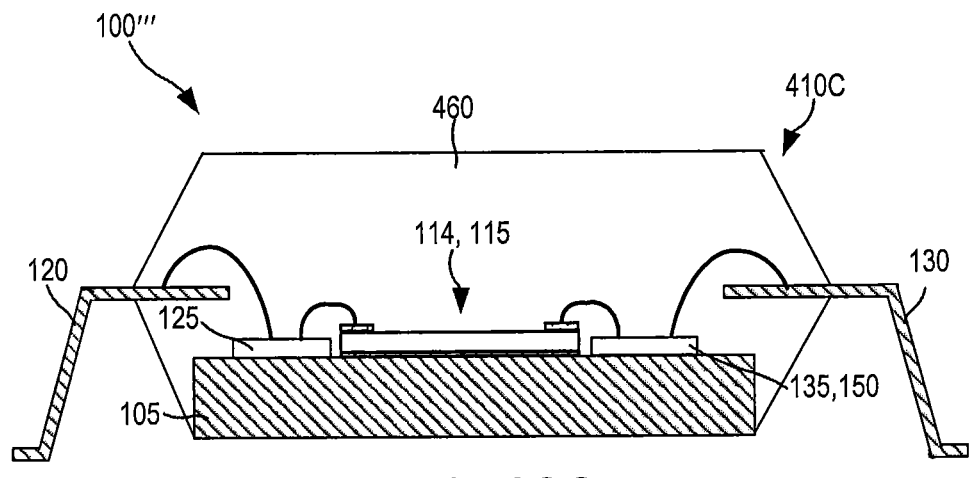

As discussed herein, the embodiments of the present disclosure may be utilized in any of a number of package formats. FIGS. 10A through 10C are schematic cross-sectional views illustrating several example ways that that the transistor amplifier dies according to embodiments of the present disclosure may be packaged to provide packaged transistor amplifiers. While FIGS. 10A-10C show variations of the amplifier package 100 of FIGS. 3-4C as an example, it will be appreciated that any of the package configurations according to embodiments of the present disclosure (e.g., amplifier packages 100A-100D, 200, 300) may be packaged in the packages illustrated in FIGS. 10A-10C.

FIG. 10A is a schematic side view of a packaged Group III nitride-based transistor amplifier 100'. As shown in FIG. 10A, amplifier package 100' includes one or more transistor amplifier die 114, 115 packaged in an open cavity package 410A. Though only one transistor amplifier die 114, 115 is illustrated in the cross-section, it will be understood that multiple transistor amplifier dies 114, 115 may be present. The package 410A includes metal input leads 120, metal output leads 130, a metal submount 105, sidewalls 440 and a lid 442. Though only one input lead 120 is illustrated in the cross-section, it will be understood that multiple input leads 120 may be present. Similarly, though only one output lead 130 is illustrated in the cross-section, it will be understood that multiple output lead 130 may be present.

The submount 105 may include materials configured to assist with the thermal management of the package 100'. For example, the submount 105 may include copper and/or molybdenum. In some embodiments, the submount 105 may be composed of multiple layers and/or contain vias/interconnects. In an example embodiment, the submount 105 may be a multilayer copper/molybdenum/copper metal flange that comprises a core molybdenum layer with copper cladding layers on either major surface thereof. In some embodiments, the submount 105 may include a metal heat sink that is part of a lead frame or metal slug. The sidewalls 440 and/or lid 442 may be formed of or include an insulating material in some embodiments. For example, the sidewalls 440 and/or lid 442 may be formed of or include ceramic materials. In some embodiments, the sidewalls 440 and/or lid 442 may be formed of, for example, $Al_2O_3$. The lid 442 may be glued to the sidewalls 440 using an epoxy glue. The sidewalls 440 may be attached to the submount 105 via, for example, brazing. The input lead 120 and the output lead 130 may be configured to extend through the sidewalls 442, though embodiments of the present disclosure are not limited thereto.

The transistor amplifier die 114, 115 is mounted on the upper surface of the metal submount 105 in an air-filled cavity 412 defined by the metal submount 105, the ceramic sidewalls 440 and the ceramic lid 442. In some embodiments, a gate terminal 432 and a drain terminal 434 of the transistor amplifier die 114, 115 are on the top side of the transistor amplifier die 114, 115, while a source terminal 436 is on the bottom side of the transistor amplifier die 114, 115. The source terminal 436 may be mounted on the metal submount 105 using, for example, a conductive die attach material (not shown). The metal submount 105 may provide the electrical connection to the source terminal 436 and may also serve as a heat dissipation structure that dissipates heat that is generated in the transistor amplifier die 114, 115. The heat is primarily generated in the upper portion of the transistor amplifier die 114, 115 where relatively high current densities are generated in, for example, the channel regions of the unit cell transistors of the transistor amplifier die 114, 115. This heat may be transferred, for example, though the source vias to the source terminal 436 and then to the metal submount 105.

Input prematch circuits 125, output prematch circuits 135, and/or combination circuits 150 may also be mounted within the package 100'. The prematch circuits 125, 135 may include impedance matching and/or harmonic termination circuits. The impedance matching circuits may be used to match the impedance of the fundamental component of RF signals that are input to or output from the transistor amplifier 410A to the impedance at the input or output of the transistor amplifier die 114, 115, respectively. The harmonic termination circuits may be used to ground harmonics of the fundamental signal that may be present at the input or output of the RF transistor amplifier die 114, 115. More than one input prematch circuit 125 and/or output prematch circuit 135 may be provided. As schematically shown in FIG. 10A, the input and output prematch circuits 125, 135 may be mounted on the metal submount 105, as discussed herein.

In addition, the combination circuit 150 discussed herein may be mounted on withing the package 100' as discussed herein. FIG. 10A illustrates the output prematch circuit 135 and the combination circuit 150 as a single element for convenience of description, but it will be understood that these can be separate elements as discussed herein. Examples of the possible configurations of the output prematch circuit 135 and the combination circuit 150 are illustrated in FIGS. 6A to 6C.

The input lead 120 may be connected to the input prematch circuit 125 by one or more bond wires, and the input prematch circuit 125 may be connected, to the gate terminal 432 of transistor amplifier die 114, 115 by one or more additional bond wires. Similarly, the output lead 130 may be connected to the combination circuit 150 and/or the output prematch circuit 135 by one or more bond wires, and the combination circuit 150 and/or the output prematch circuit 135 may be connected to the drain terminal 434 of transistor amplifier die 114, 115 by one or more additional bond wires. The bond wires, which are inductive elements, may form part of the input and/or output prematch circuits.

FIG. 10B is a schematic side view of a packaged Group III nitride-based transistor amplifier 100" that includes the RF transistor amplifier die 114, 115 packaged in a printed circuit board based package 410B. The packaged transistor amplifier 100" of FIG. 10B is very similar to the packaged transistor amplifier 100' of FIG. 10A, except that the input leads 120 and output leads 130 of package 100" are printed circuit board based leads 120, 130, 150 in package 100".

The package 100" includes a submount 105, ceramic sidewalls 440, a ceramic lid 442, each of which may be substantially identical to the like numbered elements of package 100' discussed above. The package 100" further includes a printed circuit board 420. Conductive traces on the printed circuit board 420 form an input lead 120 and an output lead 130. The printed circuit board 420 may be attached to the submount 105 via, for example, a conductive glue. The printed circuit board 420 includes a central opening and the transistor amplifier die 114, 115 is mounted within this opening on the submount 105. Other components of the amplifier package 100" may be the same as the like-numbered components of the amplifier package 100', and hence further description thereof will be omitted.

FIG. 10C is a schematic side view of another packaged Group III nitride-based transistor amplifier 100'''. Amplifier package 100''' differs from amplifier package 100' in that it includes a different package 410C. The package 410C includes a metal submount 105 (which may be similar or identical to the like numbered submount 105 of package 100'), as well as input leads 120 and output leads 130. Amplifier package 100' also includes a plastic overmold 460 that at least partially surrounds the transistor amplifier die 114, 115, the leads 120, 130, the combination circuit 150, and the metal submount 105. Other components of amplifier package 100''' may be the same as the like-numbered components of amplifier package 100' and hence further description thereof will be omitted.

While embodiments of the present invention are described above with respect to RF transistor amplifiers, it will be appreciated that embodiments of the present invention are not limited thereto. For example, the transistors described above may also be used as power transistors in switching and other applications.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash or underscore, such as 100-1, 100_1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device package comprising:
    a plurality of input leads and an output lead;
    a plurality of transistor amplifier dies having inputs respectively coupled to the plurality of input leads; and
    a combination circuit configured to combine output signals received from the plurality of transistor amplifier dies and output a combined signal to the output lead, wherein the combination circuit comprises a printed circuit board (PCB) that is within an interior of the semiconductor device package and is distinct from the output lead.

2. The semiconductor device package of claim 1, wherein the plurality of transistor amplifier dies are second transistor amplifier dies, the plurality of input leads are a plurality of second input leads, and the output lead is a second output lead, and
    wherein the semiconductor device package further comprises:
    a first input lead;
    a first output lead; and
    a first transistor amplifier die coupled between the first input lead and the first output lead.

3. The semiconductor device package of claim 2, wherein the first transistor amplifier die is a main amplifier of a Doherty amplifier and the plurality of second transistor amplifier dies are peaking amplifiers of the Doherty amplifier.

4. The semiconductor device package of claim 1, wherein the output lead is one of a plurality of output leads that are distinct from the PCB, and
    wherein the combination circuit is further configured to output the combined signal to each of the plurality of output leads.

5. The semiconductor device package of claim 1, further comprising a plurality of output prematch circuits respectively between ones of the plurality of transistor amplifier dies and the combination circuit.

6. The semiconductor device package of claim 1, wherein the plurality of input leads are configured to receive a plurality of input signals that are respectively out of phase with one another.

7. The semiconductor device package of claim 5, wherein the plurality of output prematch circuits are identical.

8. A semiconductor device package comprising:
    a plurality of input leads and an output lead;
    a plurality of transistor amplifier dies having inputs respectively coupled to the plurality of input leads;
    a combination circuit within the semiconductor device package, the combination circuit configured to combine output signals received from the plurality of transistor amplifier dies and output a combined signal to the output lead; and
    a plurality of output prematch circuits respectively between ones of the plurality of transistor amplifier dies and the combination circuit,
    wherein the combination circuit comprises a printed circuit board (PCB), and
    wherein at least one of the plurality of output prematch circuits comprises a capacitor mounted to the PCB of the combination circuit.

9. A semiconductor device package comprising:
    a plurality of input leads and an output lead;
    a plurality of transistor amplifier dies having inputs respectively coupled to the plurality of input leads;
    a combination circuit within the semiconductor device package, the combination circuit configured to combine output signals received from the plurality of transistor amplifier dies and output a combined signal to the output lead; and a plurality of output prematch circuits respectively between ones of the plurality of transistor amplifier dies and the combination circuit, wherein the combination circuit comprises a printed circuit board (PCB), and wherein at least one of the plurality of output prematch circuits comprises a capacitor coupled to the PCB of the combination circuit by a bond wire.

10. A semiconductor device package comprising:

a first transistor amplifier die coupled to a first input lead of the semiconductor device package;

a plurality of second transistor amplifier dies respectively coupled to a plurality of second input leads of the semiconductor device package; and a printed circuit board (PCB) within an interior of the semiconductor device package and configured to generate a combination of output signals of respective ones of the plurality of second transistor amplifier dies, wherein an output lead of the semiconductor device package is distinct from the PCB and is configured to output the combination of output signals of respective ones of the plurality of second transistor amplifier dies.

11. The semiconductor device package of claim 10, wherein the semiconductor device package is a Doherty amplifier package, wherein the plurality of second transistor amplifier dies comprise a first peaking transistor amplifier and a second peaking transistor amplifier of the Doherty amplifier package, and wherein the first transistor amplifier die comprises a main amplifier of the Doherty amplifier package.

12. The semiconductor device package of claim 10, wherein the PCB is further configured to combine an output of the first transistor amplifier die with the combination of the output of the plurality of second transistor amplifier dies.

13. The semiconductor device package of claim 10, wherein the output lead is one of a plurality of output leads of the semiconductor device package that are distinct from the PCB and are configured to output the combination of the output signals.

14. The semiconductor device package of claim 10, further comprising an output prematch circuit between respective ones of the plurality of second transistor amplifier dies and the PCB.

15. The semiconductor device package of claim 10, wherein the combination circuit is configured to provide a load impedance as seen from the plurality of second transistor amplifier dies that comprises primarily complex components.

16. A semiconductor device package comprising:

a plurality of transistor amplifier dies, each respectively coupled to one of a plurality of input leads of the semiconductor device package; and a combination circuit within an interior of the semiconductor device package and configured to combine output signals from two or more of the plurality of transistor amplifier dies to generate a combined output signal and provide the combined output signal to at least one output lead of the semiconductor device package, wherein the combination circuit comprises one or more printed circuit boards (PCBs).

17. The semiconductor device package of claim 16, further comprising a plurality of output prematch circuits respectively between ones of the plurality of transistor amplifier dies and the combination circuit.

18. The semiconductor device package of claim 17, wherein the combination circuit comprises a capacitor of at least one of the plurality of output prematch circuits.

19. The semiconductor device package of claim 17, wherein at least one of the plurality of output prematch circuits comprises a capacitor coupled to the combination circuit by a bond wire.

20. The semiconductor device package of claim 16, wherein the plurality of transistor amplifier dies are second transistor amplifier dies, and the at least one output lead is at least one second output lead, and wherein the semiconductor device package further comprises a first transistor amplifier die coupled to a first input lead of the plurality of input leads of the semiconductor device package.

21. The semiconductor device package of claim 20, wherein the first transistor amplifier die is a main amplifier of a Doherty amplifier and the plurality of second transistor amplifier dies are peaking amplifiers of the Doherty amplifier.

22. The semiconductor device package of claim 20, wherein the combination circuit is further configured to combine the output signals from the two or more of the plurality of second transistor amplifier dies with an output signal of the first transistor amplifier die to generate the combined output signal.

23. The semiconductor device package of claim 16, wherein the one or more PCBs comprise two or more PCBs that are respectively coupled to the two or more transistor amplifier dies.

24. The semiconductor device package of claim 23, wherein the two or more PCBs are coupled to each other by one or more bond wires.

25. The semiconductor device package of claim 23, wherein the two or more PCBs are coupled to a capacitor.

* * * * *

UNITED STATES PATENT AND TRADEMARK OFFICE
CERTIFICATE OF CORRECTION

PATENT NO. : 11,936,342 B2
APPLICATION NO. : 17/313567
DATED : March 19, 2024
INVENTOR(S) : Marbell et al.

It is certified that error appears in the above-identified patent and that said Letters Patent is hereby corrected as shown below:

In the Specification

Column 7, Line 52: Please correct "Present" to read --present--

Column 11, Line 13: Please correct "Zoffpeak*" to read --Zoff_peak*--

Column 12, Line 25: Please correct "1202" to read --120_2--

Column 15, Line 39: Please correct "1802" to read --180_2--

Column 16, Line 29: Please correct "1152" to read --115_2--

Column 24, Line 53: Please correct "100'" to read --100'''--

Signed and Sealed this
Sixteenth Day of July, 2024

Katherine Kelly Vidal
*Director of the United States Patent and Trademark Office*